US012796009B2

(12) United States Patent
Park et al.

(10) Patent No.: US 12,796,009 B2
(45) Date of Patent: Nov. 10, 2026

(54) SEMICONDUCTOR DEVICES

(71) Applicant: Samsung Electronics Co., Ltd., Suwon-si (KR)

(72) Inventors: Sungil Park, Suwon-si (KR); Minsu Seol, Suwon-si (KR); Minseok Yoo, Suwon-si (KR); Jaehyun Park, Suwon-si (KR); Kyungeun Byun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 248 days.

(21) Appl. No.: 18/668,358

(22) Filed: May 20, 2024

(65) Prior Publication Data

US 2025/0022944 A1 Jan. 16, 2025

(30) Foreign Application Priority Data

Jul. 14, 2023 (KR) ........................ 10-2023-0092034

(51) Int. Cl.
*H10D 48/36* (2025.01)
*H10D 30/43* (2025.01)
(Continued)

(52) U.S. Cl.
CPC ........... *H10D 48/362* (2025.01); *H10D 30/43* (2025.01); *H10D 30/6713* (2025.01);
(Continued)

(58) Field of Classification Search
CPC .. H10D 48/362; H10D 30/43; H10D 30/6713; H10D 30/6729; H10D 30/6735;
(Continued)

(56) References Cited

U.S. PATENT DOCUMENTS 10,388,732 B1 8/2019 Frougier et al.
11,450,666 B2 9/2022 Khaderbad et al.
(Continued)

OTHER PUBLICATIONS

"Z. Ahmed et al., "Introducing 2D-FETs in Device Scaling Roadmap using DTCO," 2020 IEEE International Electron Devices Meeting (IEDM), San Francisco, CA, USA, 2020, pp. 22.5.1-22.5.4, doi: 10.1109/IEDM13553.2020.9371906. keywords: {Two dimensional displays;".

*Primary Examiner* — Thanh Y. Tran
(74) *Attorney, Agent, or Firm* — Wolf, Greenfield & Sacks, P.C.

(57) ABSTRACT

A semiconductor device includes a fin-type active region that extends in length in a first horizontal direction on a substrate, a horizontal semiconductor layer on the fin-type active region, a seed layer on the fin-type active region and in contact with the horizontal semiconductor layer, a gate line that surrounds the horizontal semiconductor layer and the seed layer, on the fin-type active region, and that extends in length in a second horizontal direction that intersects the first horizontal direction, and a pair of vertical semiconductor layers respectively on first and second sides of the horizontal semiconductor layer in the first horizontal direction, on the fin-type active region, with the horizontal semiconductor layer therebetween, wherein an inner wall of each of the first and second vertical semiconductor layers contacts the horizontal semiconductor layer, and upper or lower surfaces of the vertical semiconductor layers contact the seed layer.

20 Claims, 48 Drawing Sheets

(51) Int. Cl.

| | |
|---|---|
| ***H10D 30/67*** | (2025.01) |
| ***H10D 62/10*** | (2025.01) |
| ***H10D 62/80*** | (2025.01) |
| ***H10D 84/85*** | (2025.01) |
| ***H10D 99/00*** | (2025.01) |
| ***H10P 14/20*** | (2026.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 62/80* (2025.01); *H10D 84/856* (2025.01); *H10D 99/00* (2025.01); *H10P 14/3436* (2026.01); *H10P 14/3462* (2026.01)

(58) Field of Classification Search
CPC .. H10D 30/6757; H10D 62/121; H10D 62/80; H10D 99/00; H10D 30/0191; H10D 30/0194; H10D 30/506; H10D 84/0128; H10P 14/3436; H10P 14/3462
See application file for complete search history.

(56) References Cited

U.S. PATENT DOCUMENTS

| | | | | |
|---|---|---|---|---|
| 11,532,709 | B2 | 12/2022 | Lee et al. | |
| 2021/0391478 | A1 | 12/2021 | Maxey et al. | |
| 2022/0077321 | A1 | 3/2022 | Seol et al. | |
| 2022/0199783 | A1 | 6/2022 | Penumatcha et al. | |
| 2023/0075559 | A1 | 3/2023 | Kim et al. | |
| 2023/0099214 | A1* | 3/2023 | Miao | H10D 30/6757 257/288 |
| 2023/0395682 | A1* | 12/2023 | Wang | H10D 84/85 |

* cited by examiner

SEMICONDUCTOR DEVICES

CROSS-REFERENCE TO RELATED APPLICATION

This application is based on and claims priority under 35 U.S.C. § 119 to Korean Patent Application No. 10-2023-0092034, filed on Jul. 14, 2023, in the Korean Intellectual Property Office, the disclosure of which is incorporated by reference herein in its entirety.

BACKGROUND

The inventive concepts relate to semiconductor devices. More specifically, the inventive concepts relate to semiconductor devices including a channel region including a two-dimensional (2D) material.

With rapid down-scaling of semiconductor devices, it is desirable to secure both relatively high operation speeds and also relatively high operation accuracy in semiconductor devices. Additionally, with an increased degree of integration and reduced sizes of semiconductor devices, the possibility of occurrence of process defects may increase during the process of manufacturing nanosheet field-effect transistors. Accordingly, development is underway of semiconductor devices having structures capable of eliminating or reducing the possibility of occurrence of process defects and improving the performance and reliability of nanosheet field-effect transistors.

SUMMARY

The present disclosure provides semiconductor devices capable of providing more stable performance and improved reliability in nanosheet field effect transistors.

According to some aspects of the inventive concepts, there is provided a semiconductor device including a fin-type active region extending in length in a first horizontal direction on a substrate, a horizontal semiconductor layer on the fin-type active region, a seed layer on the fin-type active region and in contact with the horizontal semiconductor layer, a gate line that surrounds the horizontal semiconductor layer and the seed layer on the fin-type active region and that extends in length in a second horizontal direction that intersects the first horizontal direction, and a pair of vertical semiconductor layers on first and second sides of the horizontal semiconductor layer in the first horizontal direction on the fin-type active region with the horizontal semiconductor layer therebetween, wherein an inner wall of each of the vertical semiconductor layers contacts the horizontal semiconductor layer, and upper or lower surfaces of the vertical semiconductor layers contact the seed layer.

According to some aspects of the inventive concept, there is provided a semiconductor device including a fin-type active region that extends in length in a first horizontal direction on a substrate, a pair of horizontal semiconductor layers on the fin-type active region and facing each other in a vertical direction, a gate line that surrounds the horizontal semiconductor layer on the fin-type active region and that extends in length in a second horizontal direction that intersects the first horizontal direction, and a pair of vertical semiconductor layers on first and second sides of the horizontal semiconductor layers in the first horizontal direction on the fin-type active region with the horizontal semiconductor layers therebetween, wherein an inner wall of each of the vertical semiconductor layers contacts the horizontal semiconductor layers, upper surfaces of the vertical semiconductor layers are coplanar with an upper surface of the horizontal semiconductor layer located relatively farther from the fin-type active region among the horizontal semiconductor layers, and lower surfaces of vertical semiconductor layers are coplanar with a lower surface of the horizontal semiconductor layer located relatively closer to the fin-type active region among the horizontal semiconductor layers.

According to some aspects of the inventive concepts, there is provided a semiconductor device including a fin-type active region that extends in length in a first horizontal direction on a substrate, a pair of horizontal semiconductor layers on the fin-type active region and facing each other in a vertical direction, a pair of seed layers on the fin-type active region and respectively in contact with the pair of horizontal semiconductor layers, a gate line that surrounds the pair of horizontal semiconductor layers and the pair of seed layers on the fin-type active region and that extends in length in a second horizontal direction that intersects the first horizontal direction, a pair of vertical semiconductor layers respectively on first and second sides of the pair of horizontal semiconductor layers in the first horizontal direction on the fin-type active region in the first horizontal direction with the pair of horizontal semiconductor layers therebetween, and a pair of source/drain contacts adjacent to the gate line with the gate line therebetween, wherein inner walls of the pair of vertical semiconductor layers respectively contact the pair of horizontal semiconductor layers, upper and lower surfaces of the pair of vertical semiconductor layers contact the pair of seed layers, an upper surface of each of the pair of vertical semiconductor layers is coplanar with an upper surface of the horizontal semiconductor layer located on a relatively upper side among the pair of horizontal semiconductor layers, and a lower surface of each of the pair of vertical semiconductor layers is coplanar with a lower surface of the horizontal semiconductor layer located on a relatively lower side among the pair of horizontal semiconductor layers.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
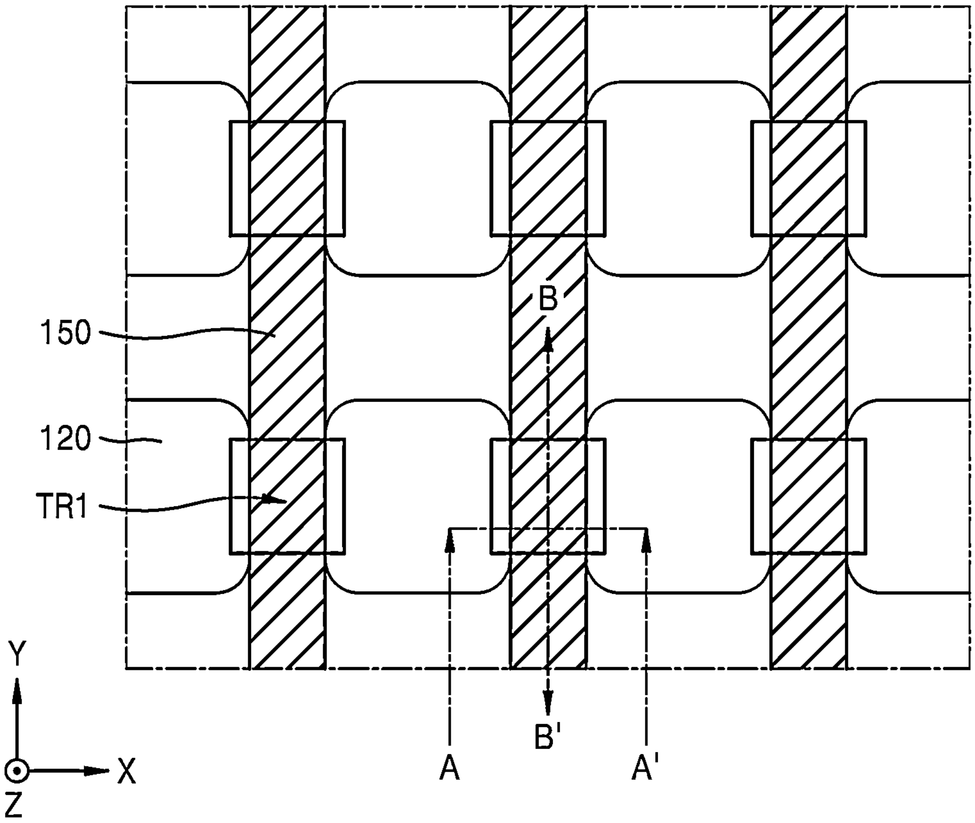
FIG. 1 is a schematic plan view showing a semiconductor device according to some embodiments.

Hereinafter, some examples of embodiments of the inventive concepts will be described in detail with reference to the accompanying drawings. The same reference numerals may be used for the same components in the drawings, and redundant descriptions thereof are omitted herein in the interest of brevity.

Figure 2:
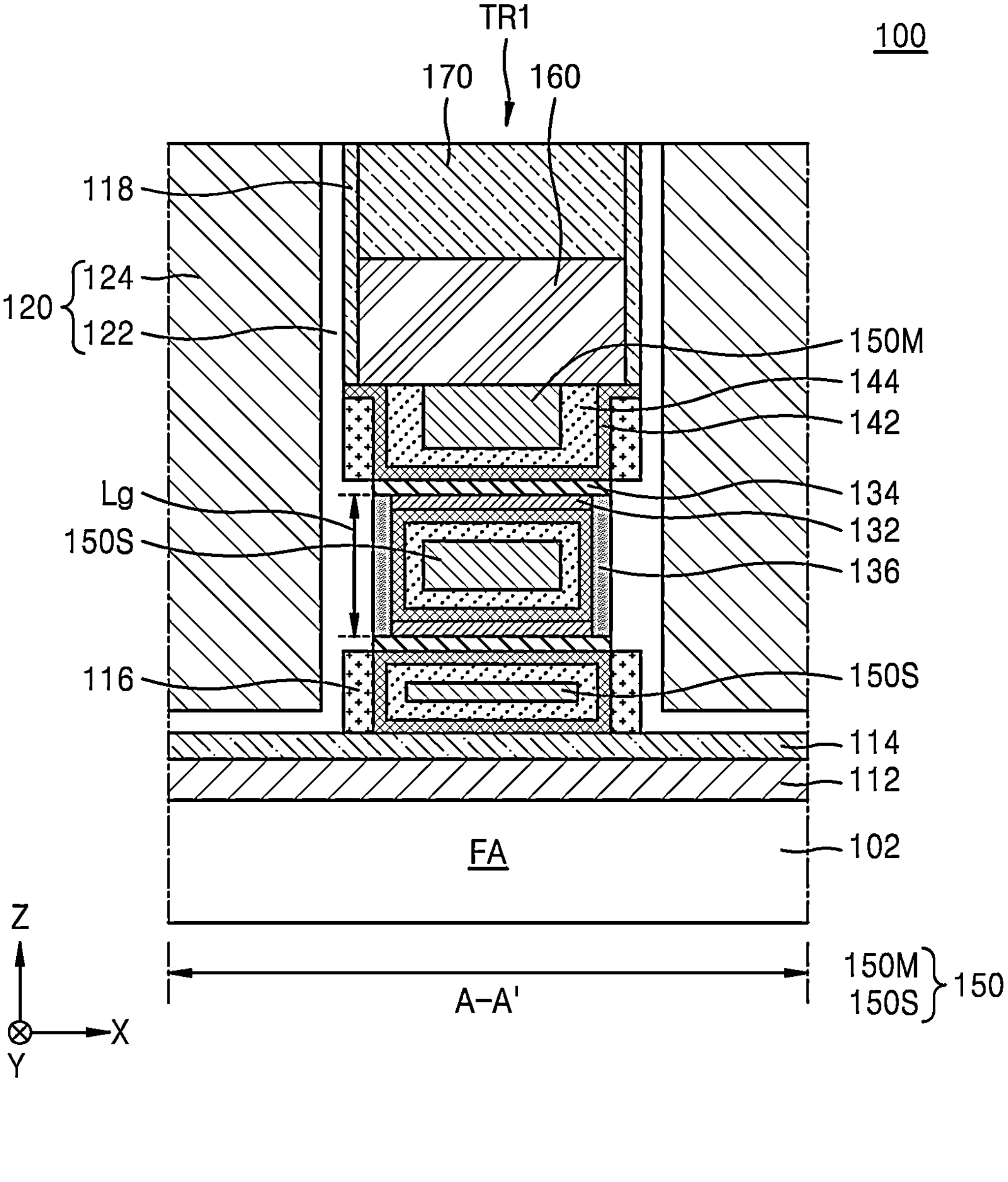
FIG. 2 is a cross-sectional view taken along a line A-A' of FIG. 1.
Figure 3:
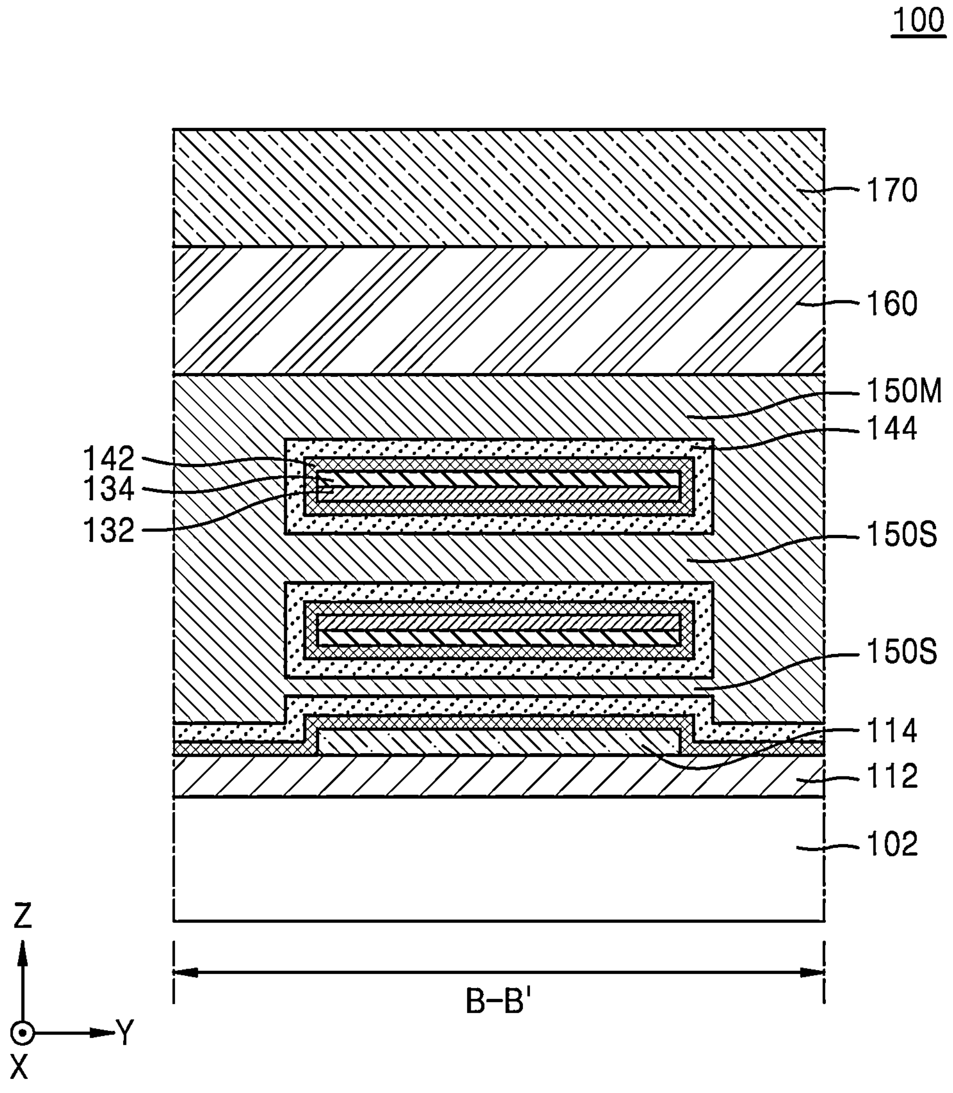
FIG. 3 is a cross-sectional view taken along a line B-B' of FIG. 1.

FIG. 1 is a schematic plan view showing a semiconductor device 100 according to some embodiments. FIG. 2 is a cross-sectional view taken along a line A-A' of FIG. 1. FIG. 3 is a cross-sectional view taken along a line B-B' of FIG. 1.

Referring to FIGS. 1 to 3, the semiconductor device 100 may include a plurality of fin-type active regions FA that protrude upward from a substrate 102 in a vertical direction (Z direction) and extending in length in a first horizontal direction (X direction), and a horizontal semiconductor layer 132 on the plurality of fin-type active regions FA.

The substrate 102 may include a semiconductor such as Si or Ge, or a compound semiconductor such as SiGe, SiC, GaAs, InAs, InGaAs, or InP. As used herein, the terms “SiGe”, “SiC”, “GaAs”, “InAs”, “InGaAs”, and “InP” mean materials including elements included in the terms, and are not chemical equations exhibiting a stoichiometric relationship.

A device isolation layer (not shown) may cover first and second sidewalls of each of the plurality of fin-type active regions FA and may be on the substrate 102. The device isolation layer may include, for example, an oxide layer, a nitride layer, or a combination thereof.

A plurality of gate lines 150 may be on the plurality of fin-type active regions FA. Each of the plurality of gate lines 150 may extend in length in a second horizontal direction (Y direction) that intersects the first horizontal direction (X direction).

In areas where the plurality of fin-type active regions FA and the plurality of gate lines 150 cross each other, a plurality of horizontal semiconductor layers 132 and a plurality of seed layers 134 may be respectively on upper portions of the plurality of fin-type active regions FA.

The horizontal semiconductor layer 132 may function as a channel region of a first transistor TR1. The horizontal semiconductor layer 132 may extend relatively longer in the first horizontal direction (X direction) than in the vertical direction (Z direction) on a plane (i.e., X-Z plane) perpendicular to the second horizontal direction (Y direction). The horizontal semiconductor layer 132 may include two layers facing each other in the vertical direction (Z direction) on the plurality of fin-type active regions FA.

In some embodiments, the two layers of the horizontal semiconductor layer 132 may have substantially the same thickness in the vertical direction (Z direction). In some embodiments, the two layers of the horizontal semiconductor layer 132 may have different thicknesses in the vertical direction (Z direction). For example, a thickness of the horizontal semiconductor layer 132 located on a relatively upper side among the horizontal semiconductor layers 132 may be greater than a thickness of the horizontal semiconductor layer 132 located on a relatively lower side among the horizontal semiconductor layers 132 in the vertical direction (Z direction).

In some embodiments, the two layers of the horizontal semiconductor layer 132 may have substantially the same size in the first horizontal direction (X direction). In some embodiments, the two layers of the horizontal semiconductor layer 132 may have different sizes in the first horizontal direction (X direction).

In some embodiments, the horizontal semiconductor layer 132 may include a two-dimensional (2D) material. For example, the horizontal semiconductor layer 132 may include transition metal dichalcogenide (TMD). For example, the TMD may include at least one of $MoS_2$, $WS_2$, or $WSe_2$.

A seed layer 134 of the plurality of seed layers 134 may contact each layer of the horizontal semiconductor layer 132. For example, a seed layer 134 (e.g., a first seed layer 134) that located on a relatively upper side among the seed layers 134 may be on an upper surface of the horizontal semiconductor layer 132 (e.g., a first horizontal semiconductor layer 132) located on the relatively upper side among the horizontal semiconductor layers 132, and a seed layer 134 (e.g., a second seed layer 134) located on a relatively lower side among the seed layers 134 may be on a lower surface of the horizontal semiconductor layer 132 (e.g., a second horizontal semiconductor layer 132) located on the relatively lower side among the horizontal semiconductor layers 132. First and second sidewalls of the seed layer 134 in the first horizontal direction (X direction) may overlap or be aligned with an inner wall of an insulating spacer 116 in the vertical direction (Z direction). In some embodiments, the seed layer 134 may be an oxide of transition metal included in the TMD of the horizontal semiconductor layer 132 or a catalyst of the transition metal oxide. For example, when the horizontal semiconductor layer 132 includes $MoS_2$, the seed layer 134 may include $MoO_4$ which is an oxide of Mo that is transition metal included in $MoS_2$, or at least one of $Na_2MoO_4$ and $K_2MoO_4$ which are oxide catalysts of Mo.

In some embodiments, a horizontal width of the seed layer 134 may be greater than a horizontal width of the horizontal semiconductor layer 132 in the first horizontal direction (X direction). Accordingly, a portion of the seed layer 134 may extend in the first horizontal direction (X direction) to the outside of the horizontal semiconductor layer 132, and may not overlap the horizontal semiconductor layer 132 in the vertical direction (Z direction).

Each of the plurality of gate lines 150 may include a main gate portion 150M and a plurality of sub-gate portions 150S. The main gate portion 150M may be on upper sides of the horizontal semiconductor layer 132 and the seed layer 134 and may extend in the second horizontal direction (Y direction). The plurality of sub-gate portions 150S may be integrally connected to the main gate portion 150M, and each may be each between the two layers of the horizontal semiconductor layer 132 or between the seed layer 134 located on the relatively lower side among the seed layers 134 and the fin-type active region FA. In the vertical direction (Z direction), a thickness of each of the plurality of sub-gate portions 150S may be less than a thickness of the main gate portion 150M.

Each of the plurality of gate lines 150 may include metal, metal carbide, or a combination thereof. The metal may be selected from Ti, W, Ru, Nb, Mo, Hf, Ni, Co, Pt, Yb, Tb, Dy, Er, and Pd. The metal carbide may be TiAlC. However, the material of each of the plurality of gate lines 150 is not limited thereto.

A first gate dielectric layer 142 may be between the gate line 150 and the horizontal semiconductor layer 132 and between the gate line 150 and the seed layer 134. In some embodiments, the first gate dielectric layer 142 may have a stacked structure of an interface dielectric layer and a high dielectric layer. The interface dielectric layer may include a low dielectric material layer having a permittivity of about 9 or less, for example, a silicon oxide layer, a silicon oxynitride layer, or a combination thereof. In some embodiments, the interface dielectric layer may be omitted. The high dielectric layer may include a material having a higher dielectric constant than that of the silicon oxide layer. For example, the high dielectric layer may have a dielectric constant of about 10 to about 25. The high dielectric layer may include hafnium oxide, but the present disclosure is not limited thereto.

A second gate dielectric layer 144 may be between the first gate dielectric layer 142 and the gate line 150. The second gate dielectric layer 144 may include a metal nitride layer. The metal nitride layer may include, for example, a titanium nitride layer, a tantalum nitride layer, a molybdenum nitride layer, or a combination of two or more thereof.

The insulating spacer 116 may be on both sidewalls of the main gate portion 150M and on both sidewalls of the sub-gate portion 150S located in a relatively lower end among the plurality of sub-gate portions 150S. The insulating spacer 116 may be spaced apart from the gate line 150 with the first gate dielectric layer 142 and the second gate dielectric layer 144 therebetween. The insulating spacer 116 may include, for example, silicon nitride, silicon oxide, SiCN, SiBN, SION, SIOCN, SiBCN, SiOC, or a combination of two or more thereof.

A pair of vertical semiconductor layers 136 may be on both sides of the horizontal semiconductor layer 132 in the first horizontal direction (X direction), with the horizontal semiconductor layer 132 between the pair (first and second) vertical semiconductor layers 136. Each vertical semiconductor layer 136 may extend relatively longer in the vertical direction (Z direction) than in the first horizontal direction (X direction) on the plane (i.e., X-Z plane) perpendicular to the second horizontal direction (Y direction). Each of the pair of vertical semiconductor layers 136 may function as a source/drain region of the first transistor TR1. An upper surface of each of the pair of vertical semiconductor layers 136 may be coplanar with the upper surface of the horizontal semiconductor layer 132 located on the relatively upper side among the horizontal semiconductor layers 132, and a lower surface of each of the pair of vertical semiconductor layers 136 may be coplanar with the lower surface of the horizontal semiconductor layer 132 located on the relatively lower side among the horizontal semiconductor layers 132. Inner sidewalls of the pair of vertical semiconductor layers 136 may contact both sidewalls of the horizontal semiconductor layer 132, and upper and lower surfaces thereof may contact the seed layer 134. In some embodiments, a sidewall of the vertical semiconductor layer 136 contacting the horizontal semiconductor layer 132 may have a vertical length Lg of about 5 nm to about 20 nm in the vertical direction (Z direction). In some embodiments, the vertical semiconductor layer 136 may include a two-dimensional (2D) material doped with impurities. For example, the 2D material may be TMD, and the impurities may be p-type impurities or n-type impurities. The p-type impurities may be, for example, boron, and the n-type impurities may be, for example, phosphorus. In some embodiments, a concentration of impurities of the vertical semiconductor layer 136 may be about $10^{18}/cm^3$ to about $10^{21}/cm^3$. In some embodiments, the vertical semiconductor layer 136 may include substantially the same material as that of the horizontal semiconductor layer 132. For example, the horizontal semiconductor layer 132 may include $MoS_2$, and the vertical semiconductor layer 136 may include $MoS_2$ doped with impurities.

In some embodiments, each vertical semiconductor layer 136 may extend in the first horizontal direction (X direction) such that an inner wall of the insulating spacer 116 and an outer wall of the vertical semiconductor layer 136 overlap in the vertical direction (Z direction). Accordingly, the vertical semiconductor layer 136 may include a portion that overlaps the seed layer 134 in the vertical direction (Z direction) and may not include a portion that overlaps the insulating spacer 116 in the vertical direction (Z direction). The pair of vertical semiconductor layers 136 may be disposed inside the insulating spacer 116 in the first horizontal direction (X direction).

A barrier layer 160 and an upper insulating layer 170 may be on the main gate portion 150M. The barrier layer 160 may cover an upper surface of the main gate portion 150M, and the upper insulating layer 170 may cover an upper surface of the barrier layer 160. In some embodiments, the barrier layer 160 may include a metal nitride layer. For example, the metal nitride layer may be TiN. In some embodiments, the upper insulating layer 170 may include a silicon nitride layer, a silicon oxide layer, or a combination thereof.

An insulating liner 118 may be on both sidewalls of the barrier layer 160 and both sidewalls of the upper insulating layer 170. The insulating liner 118 may cover both sidewalls of the barrier layer 160 and both sidewalls of the upper insulating layer 170. The insulating liner 118 may include, for example, silicon nitride, silicon oxide, SiCN, SiBN, SION, SIOCN, SiBCN, SiOC, or a combination of two or more thereof.

A pair of source/drain contacts 120 may be on both sides of the gate line 150 in the first horizontal direction (X direction), with one gate line 150 therebetween on the fin-type active region FA. One of the pair of source/drain contacts 120 may be on the fin-type active region FA between horizontal semiconductor layers 132 horizontally adjacent to each other in the first horizontal direction (X direction). The source/drain contact 120 may contact the outer wall of each of the pair of vertical semiconductor layers 136 on one sidewall thereof.

In some embodiments, the source/drain contact 120 may include a first metal layer 122 and a second metal layer 124. The first metal layer 122 may cover a sidewall of the insulating liner 118, a sidewall of the insulating spacer 116, a sidewall of the seed layer 134, and a sidewall of the vertical semiconductor layer 136. A portion of the first metal layer 122 may protrude in the first horizontal direction (X direction) toward the vertical semiconductor layer 136. The protruding portion may overlap the insulating spacer 116 in the vertical direction (Z direction) and may not overlap the seed layer 134 in the vertical direction (Z direction). The protruding portion may have a horizontal width that is substantially the same as that of the insulating spacer 116 in the first horizontal direction (X direction). The protruding portion may contact the outer wall of each of the pair of vertical semiconductor layers 136. The first metal layer 122 may include, for example, Sb, Bi, In, Se, or a combination of two or more thereof. The second metal layer 124 may contact the first metal layer 122. The second metal layer 124 may include, for example, Au, Ni, Pd, Pt, or a combination of two or more thereof. In some embodiments, the first metal layer 122 may be omitted. In this case, the second metal layer 124 may cover the sidewall of the insulating liner 118, the sidewall of the insulating spacer 116, the sidewall of the seed layer 134, and the sidewall of the vertical semiconductor layer 136.

As illustrated in FIG. 1, a plurality of first transistors TR1 may be formed on portions of the substrate 102 where the plurality of fin-type active regions FA and the plurality of gate lines 150 cross each other. The plurality of first transistors TR1 may be, for example, gate-all-around field effect transistors (GAAFETs) or multi-bridge-channel field effect transistors (MBCFETs). The plurality of first transistors TR1 may form a logic circuit or a memory device.

A lower insulating layer 114 may be between the substrate 102 and the first gate dielectric layer 142. The lower insulating layer 114 may include, for example, a silicon oxide layer, a silicon nitride layer, or a combination thereof.

An etch stop layer 112 may be between the lower insulating layer 114 and the substrate 102. For example, the etch stop layer 112 may include a silicon oxide layer, a silicon nitride layer, or a combination thereof.

The semiconductor device 100 according to some embodiments may include the vertical semiconductor layer 136 that functions as a source/drain region and that contacts the horizontal semiconductor layer 132 functioning as the channel region. At this time, a sidewall having a relatively large area of the vertical semiconductor layer 136 may contact the source/drain contact 120, so that the resistance of the source/drain contact 120 may be alleviated or reduced. Accordingly, the electrical performance of the semiconductor device 100 including the vertical semiconductor layer 136 may be improved.

Figure 4:
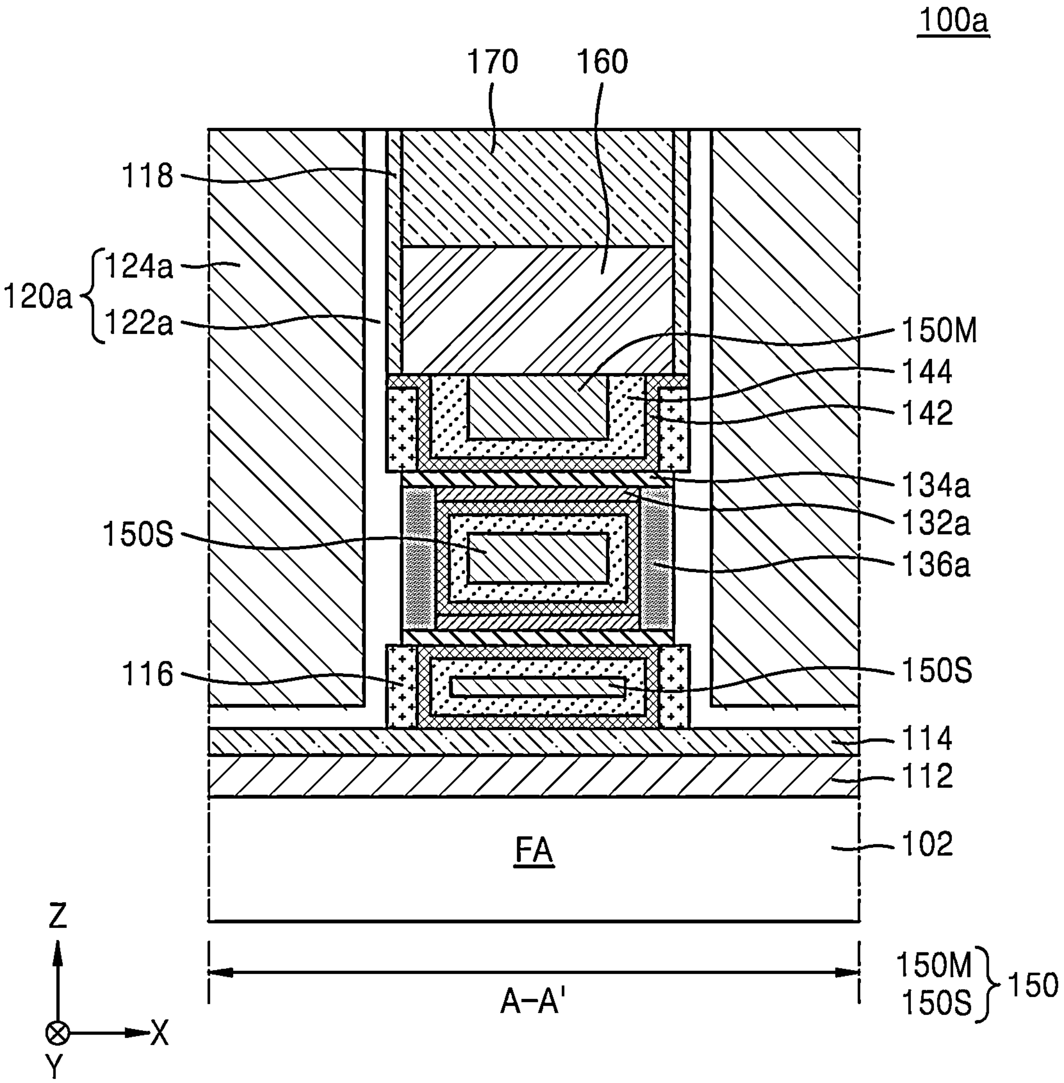
FIG. 4 is a cross-sectional view showing a semiconductor device according to some embodiments.
Figure 5:
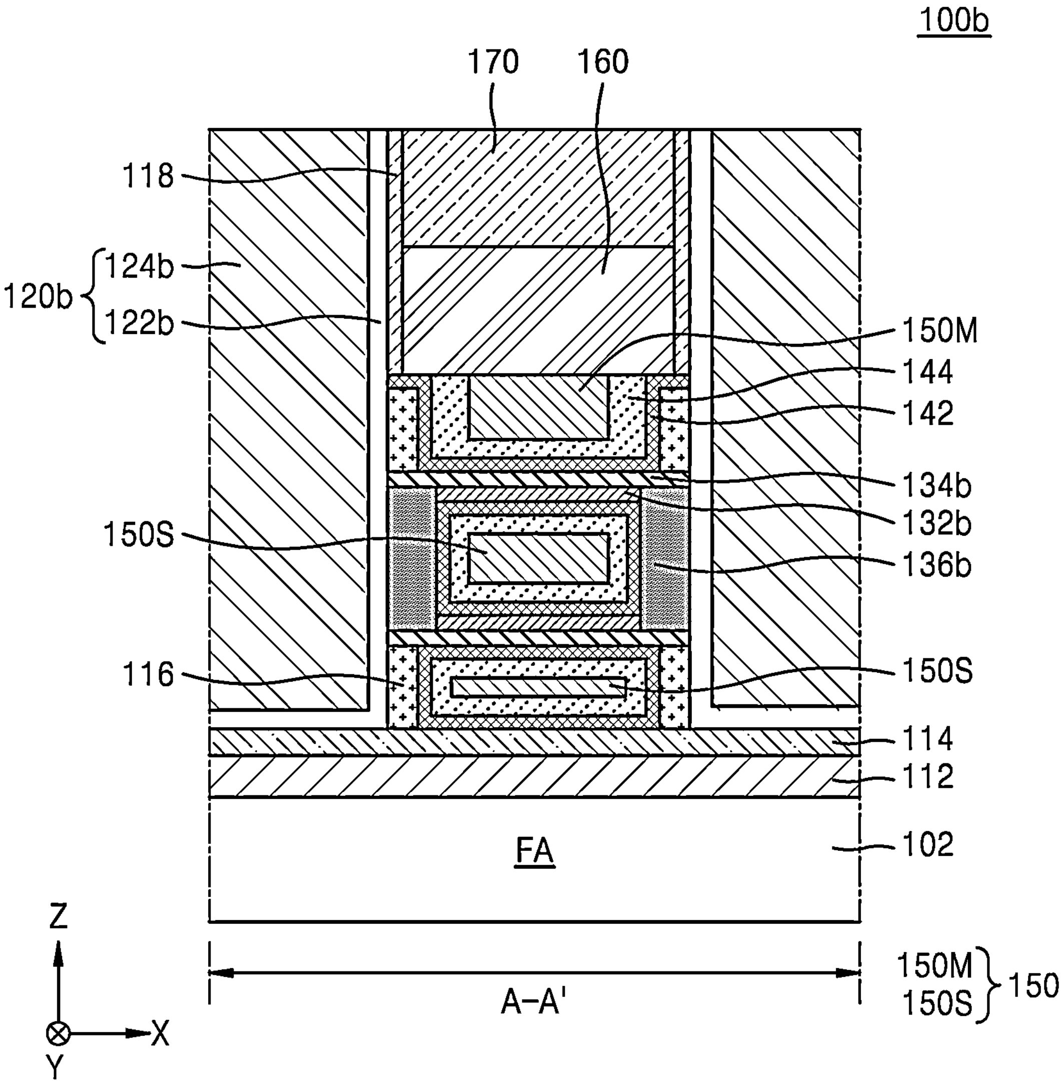
FIG. 5 is a cross-sectional view showing a semiconductor device according to some embodiments.

FIG. 4 is a cross-sectional view showing a semiconductor device 100*a* according to some embodiments. FIG. 5 is a cross-sectional view showing a semiconductor device 100*b* according to some embodiments. Some components of the semiconductor device 100*a* illustrated in FIG. 4 and the semiconductor device 100*b* illustrated in FIG. 5 may be similar to components of the semiconductor device 100 described with reference to FIGS. 1 to 3, and thus, the differences are mainly described below.

Referring to FIG. 4, in areas where the plurality of fin-type active regions FA and the plurality of gate lines 150 cross each other, the semiconductor device 100*a* may include a plurality of horizontal semiconductor layers 132*a* and a plurality of seed layers 134*a* respectively on upper portions of the plurality of fin-type active regions FA and a pair of vertical semiconductor layers 136*a* on first and second sides of the horizontal semiconductor layer 132*a* in the first horizontal direction (X direction) with the horizontal semiconductor layer 132*a* therebetween.

In some embodiments, the horizontal semiconductor layer 132*a* may not include a portion that overlaps the insulating spacer 116 in the vertical direction (Z direction), and the seed layer 134*a* may include a portion that overlaps the insulating spacer 116 in the vertical direction (Z direction). In some embodiments, the seed layer 134*a* may contact the insulating spacer 116. For example, the seed layer 134*a* located on a relatively upper side among the seed layers 134*a* may contact a part of a lower surface of the insulating spacer 116 on a sidewall of the main gate portion 150M at a part of an upper surface thereof.

In some embodiments, the vertical semiconductor layer 136*a* may extend in the first horizontal direction (X direction) such that an outer wall of the vertical semiconductor layer 136*a* is located between an inner wall of the insulating spacer 116 and an outer wall of the insulating spacer 116. Accordingly, the vertical semiconductor layer 136*a* may include a portion that overlaps a part of the insulating spacer 116 in the vertical direction (Z direction).

A pair of source/drain contacts 120*a* may be on both sides of the gate line 150 in the first horizontal direction (X direction) with one gate line 150 therebetween on the fin-type active region FA. The source/drain contact 120*a* may include a first metal layer 122*a* and a second metal layer 124*a*. A portion of the first metal layer 122*a* may protrude in the first horizontal direction (X direction) toward the vertical semiconductor layer 136*a*. The protruding portion may have a horizontal width that is less than that of the insulating spacer 116 in the first horizontal direction (X direction).

Referring to FIG. 5, in areas where the plurality of fin-type active regions FA and the plurality of gate lines 150 cross each other, the semiconductor device 100*b* may include a plurality of horizontal semiconductor layers 132*b* and a plurality of seed layers 134*b* respectively on upper portions of the plurality of fin-type active regions FA and a pair of vertical semiconductor layers 136*b* on first and second sides of the horizontal semiconductor layer 132*b* in the first horizontal direction (X direction) with the horizontal semiconductor layer 132*b* therebetween.

In some embodiments, the horizontal semiconductor layer 132*b* may not include a portion overlapping the insulating spacer 116 in the vertical direction (Z direction), and the seed layer 134*b* may include a portion overlapping the insulating spacer 116 in the vertical direction (Z direction). In this case, the insulating spacer 116 may overlap the seed layer 134*b* in the vertical direction (Z direction) over an entire area or length in the first horizontal direction (X direction). Accordingly, both sidewalls of the seed layer 134*b* may overlap an outer wall of the insulating spacer 116 in the vertical direction (Z direction). In some embodiments, the seed layer 134*b* may contact the insulating spacer 116. For example, the seed layer 134*b* located on a relatively upper side among the seed layers 134*b* may contact a lower surface of the insulating spacer 116 on a sidewall of the main gate portion 150M at a part of an upper surface thereof.

In some embodiments, the vertical semiconductor layer 136*b* may extend in the first horizontal direction (X direction) such that an outer wall of the insulating spacer 116 and an outer wall of the vertical semiconductor layer 136*b* overlap or are aligned in the vertical direction (Z direction). Accordingly, the vertical semiconductor layer 136*b* may include a portion that overlaps the entirety of the insulating spacer 116 in the vertical direction (Z direction).

A pair of source/drain contacts 120*b* may be on both sides of the gate line 150 in the first horizontal direction (X direction) with one gate line 150 therebetween on the fin-type active region FA. The source/drain contact 120*b* may include a first metal layer 122*b* and a second metal layer 124*b*. The first metal layer 122*b* may contact an outer wall of the vertical semiconductor layer 136*b* on a sidewall thereof. The first metal layer 122*b* may not include a protruding portion, in contrast to the first metal layer 122 illustrated in FIGS. 1 to 3 or the first metal layer 122*a* illustrated in FIG. 4.

Figure 6:
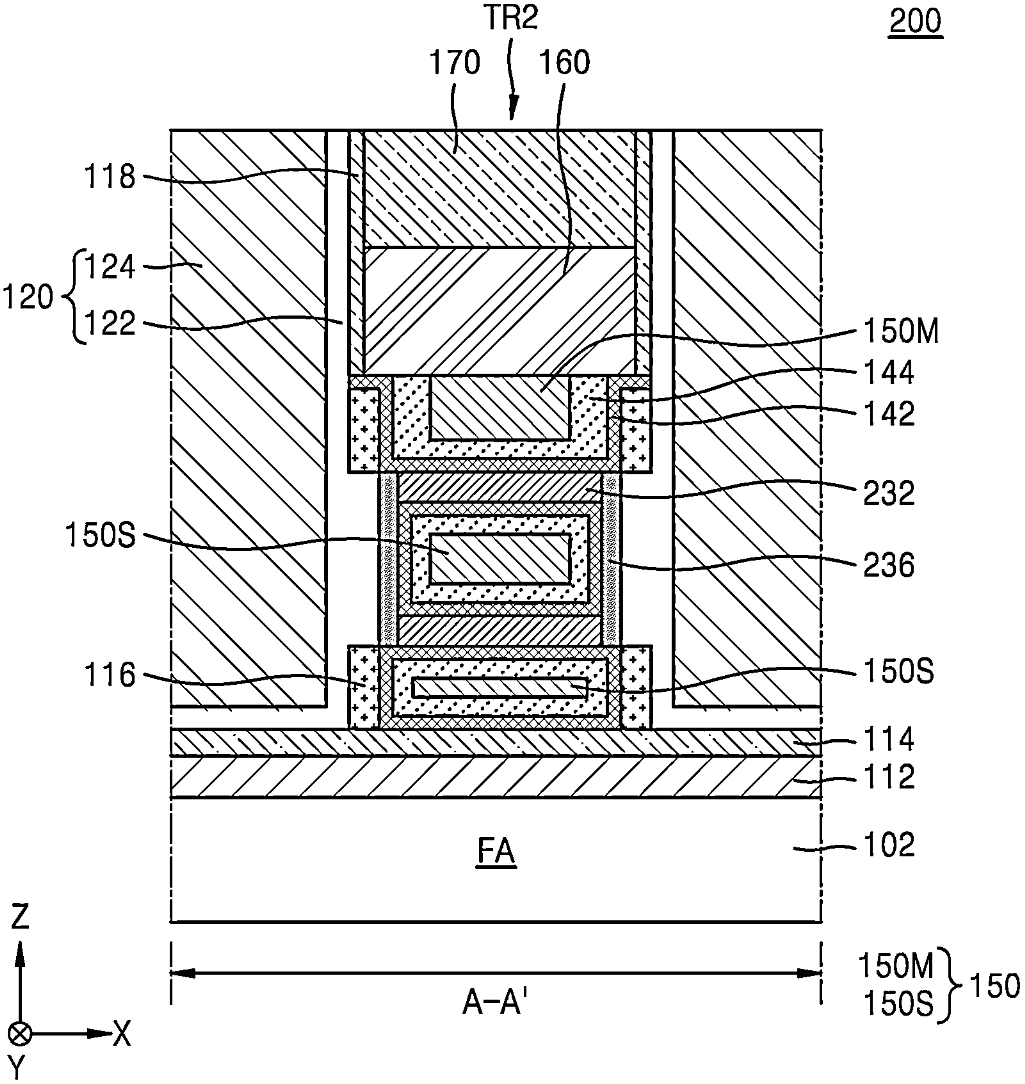
FIG. 6 is a cross-sectional view of the semiconductor device taken along the line A-A' of FIG. 1.
Figure 7:
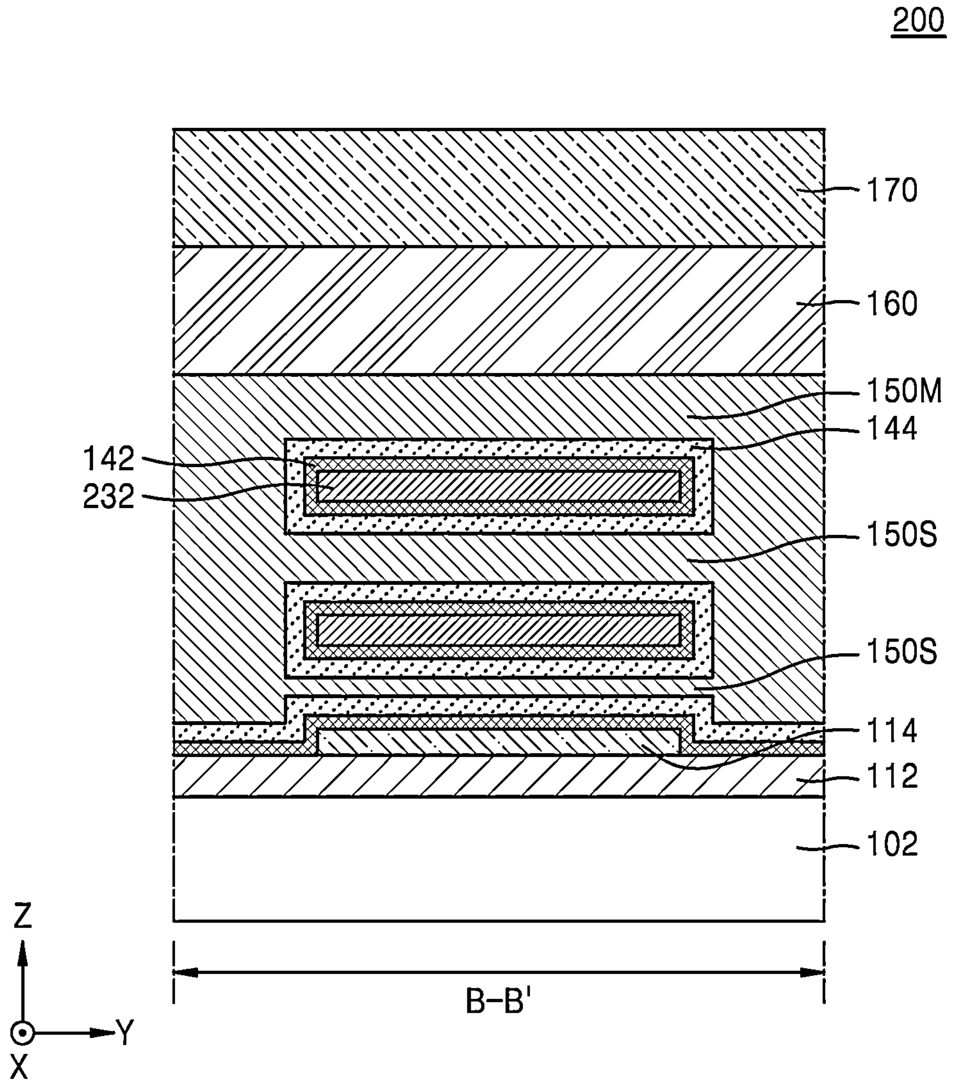
FIG. 7 is a cross-sectional view of the semiconductor device taken along the line B-B' of FIG. 1.

FIG. 6 is a cross-sectional view of the semiconductor device 200 taken along the line A-A' of FIG. 1. FIG. 7 is a cross-sectional view of the semiconductor device 200 taken along the line B-B' of FIG. 1. Some components of the semiconductor device 200 illustrated in FIGS. 6 and 7 may be similar to components of the semiconductor device 100 described with reference to FIGS. 1 to 3, and thus, the differences are mainly described below.

Referring to FIGS. 6 and 7, the semiconductor device 200 may include the plurality of fin-type active regions FA and a plurality of horizontal semiconductor layers 232 on the plurality of fin-type active regions FA, and may not include the seed layer 134 illustrated in FIGS. 2 and 3. The plurality of gate lines 150 may be on the plurality of fin-type active regions FA, and the plurality of horizontal semiconductor layers 232 may be respectively on upper portions of the plurality of fin-type active regions FA in areas where the plurality of fin-type active regions FA and the plurality of gate lines 150 cross each other.

The horizontal semiconductor layer 232 may function as a channel region of a second transistor TR2. In some embodiments, an upper surface, a lower surface, and sidewalls of the horizontal semiconductor layer 232 facing each other in the second horizontal direction (Y direction) may be covered by the first gate dielectric layer 142 between the gate line 150 and the horizontal semiconductor layer 232, and sidewalls of the horizontal semiconductor layer 232 facing each other in the first horizontal direction (X direction) may be covered by a vertical semiconductor layer 236.

In some embodiments, the horizontal semiconductor layer 232 may include a material that is substantially the same as or similar to that of the horizontal semiconductor layer 132 of the semiconductor device 100 described with reference to FIGS. 1 to 3.

A pair of vertical semiconductor layers 236 may be on first and second sides (e.g., respective sides) of the horizontal semiconductor layer 232 with the horizontal semiconductor layer 232 therebetween. Each of the pair of vertical semiconductor layers 236 may function as a source/drain region of the second transistor TR2. Inner sidewalls of the pair of vertical semiconductor layers 236 may contact sidewalls of the horizontal semiconductor layer 232, and upper and lower surfaces thereof may contact the first gate dielectric layer 142. The upper surface of the vertical semiconductor layer 236 may be coplanar with the upper surface of the horizontal semiconductor layer 232 located on a relatively upper side among the horizontal semiconductor layers 232, and the lower surface of the vertical semiconductor layer 236 may be coplanar with the lower surface of the horizontal semiconductor layer 232 located on a relatively lower side among the horizontal semiconductor layers 232. In some embodiments, the vertical semiconductor layer 236 may include a material that is substantially the same as or similar to the vertical semiconductor layer 136 of the semiconductor device 100 described with reference to FIGS. 1 to 3.

In some embodiments, the vertical semiconductor layer 236 may extend in the first horizontal direction (X direction) such that an inner wall of the insulating spacer 116 and an outer wall of the vertical semiconductor layer 236 overlap or are aligned in the vertical direction (Z direction). Accordingly, the vertical semiconductor layer 236 may include a portion that overlaps the first gate dielectric layer 142 in the vertical direction (Z direction) and may not include a portion that overlaps the insulating spacer 116 in the vertical direction (Z direction). The pair of vertical semiconductor layers 236 may be inside the insulating spacer 116 in the first horizontal direction (X direction).

Figure 8:
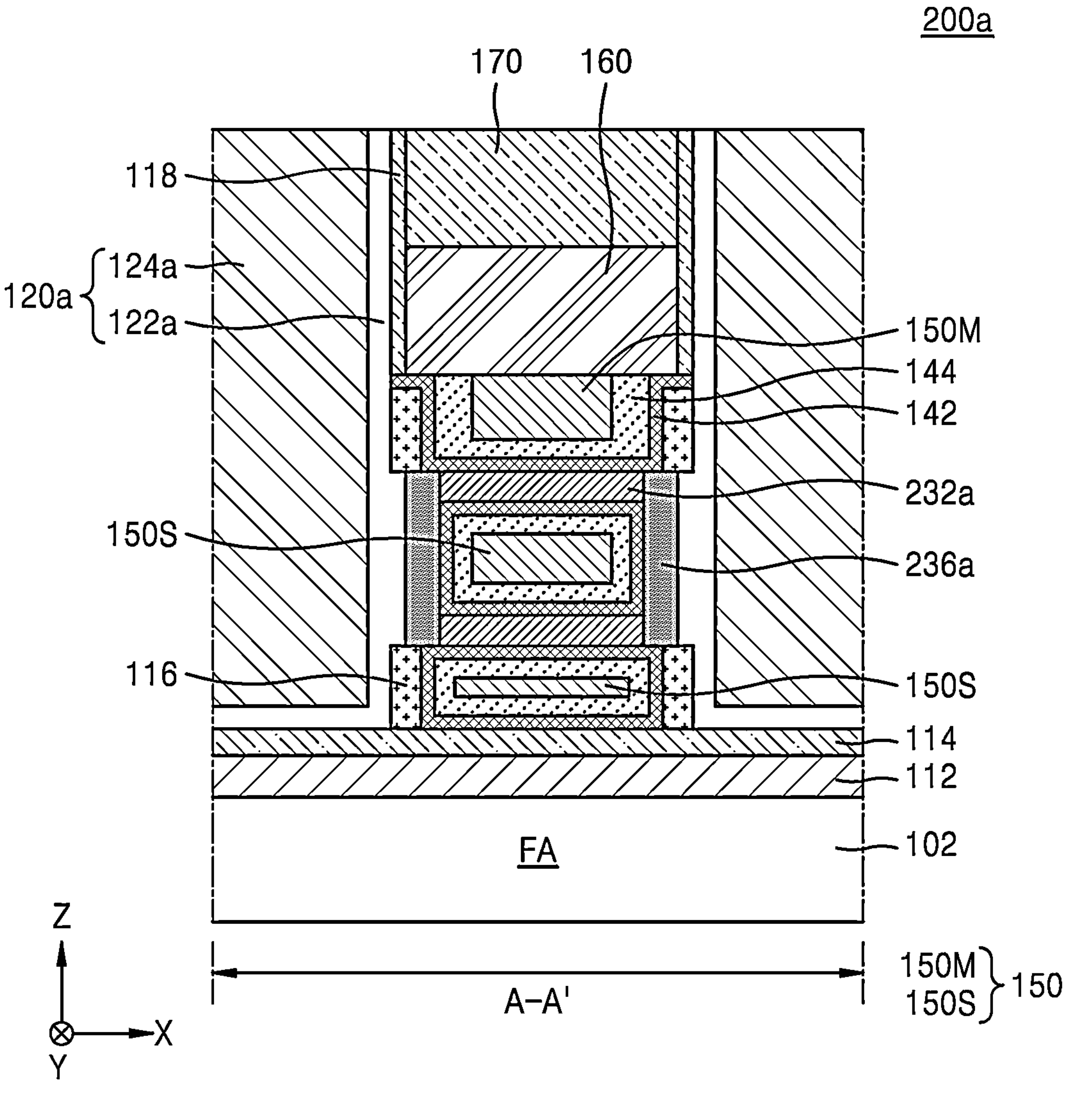
FIG. 8 is a cross-sectional view showing a semiconductor device according to some embodiments.
Figure 9:
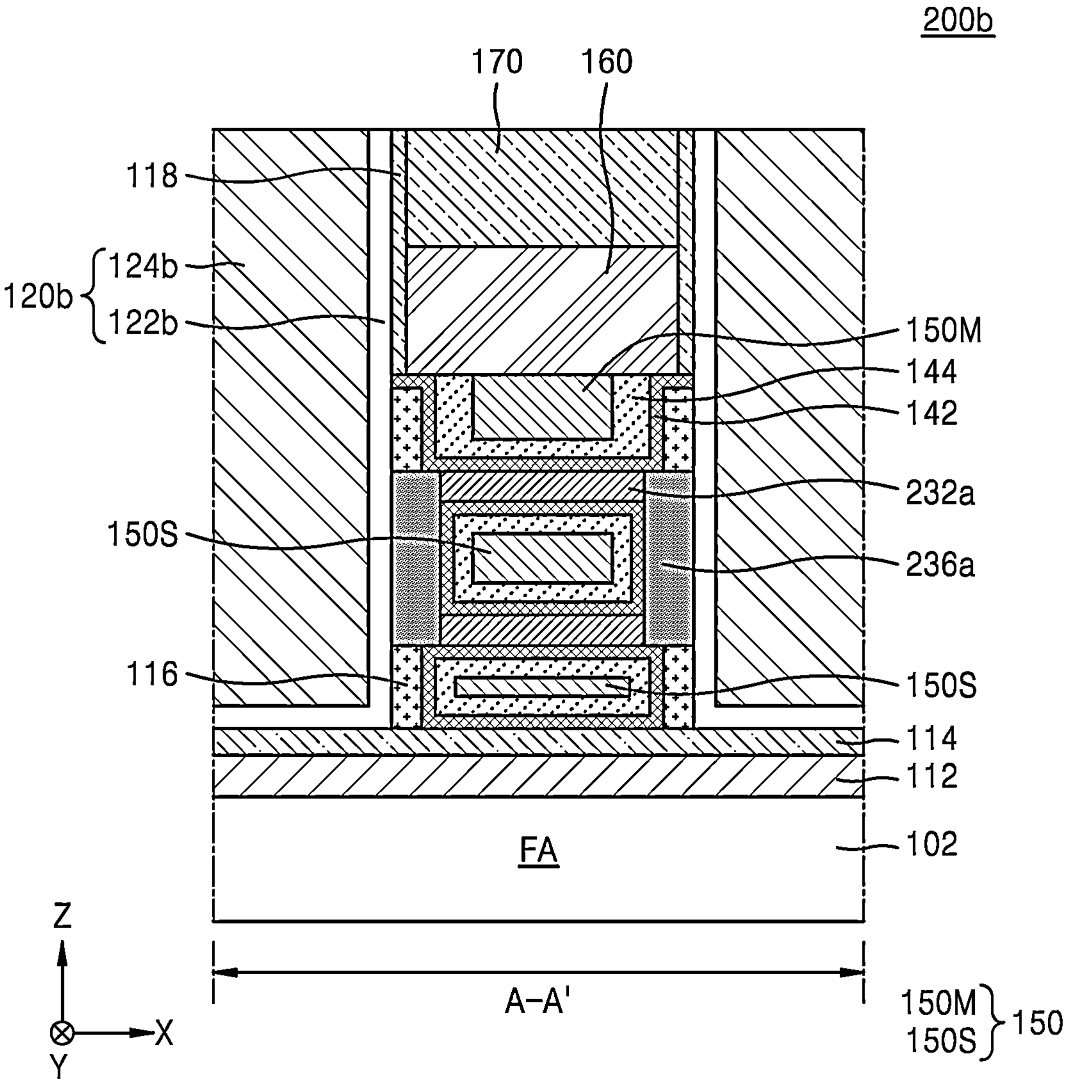
FIG. 9 is a cross-sectional view showing a semiconductor device according to some embodiments.

FIG. 8 is a cross-sectional view showing a semiconductor device 200*a* according to some embodiments. FIG. 9 is a cross-sectional view showing a semiconductor device 200*b* according to some embodiments. Some components of the semiconductor device 200*a* illustrated in FIG. 8 and the semiconductor device 200*b* illustrated in FIG. 9 may be similar to components of the semiconductor device 200 described with reference to FIGS. 6 and 7, and thus, the differences are mainly described below.

Referring to FIG. 8, in areas where the plurality of fin-type active regions FA and the plurality of gate lines 150 cross each other, the semiconductor device 200*a* may include a plurality of horizontal semiconductor layers 232*a* respectively on upper portions of the plurality of fin-type active regions FA and a pair of vertical semiconductor layers 236*a* on both sides of the horizontal semiconductor layer 232*a* in the first horizontal direction (X direction) with the horizontal semiconductor layer 232*a* therebetween.

In some embodiments, the vertical semiconductor layer 236*a* may extend in the first horizontal direction (X direction) such that an outer wall of the vertical semiconductor layer 236*a* is located between an inner wall of the insulating spacer 116 and an outer wall of the insulating spacer 116. Accordingly, the vertical semiconductor layer 236*a* may include a portion that overlaps a part of the insulating spacer 116 in the vertical direction (Z direction).

In some embodiments, upper and lower surfaces of the vertical semiconductor layer 236*a* may contact the insulating spacer 116. For example, a part of the upper surface and a part of the lower surface of the vertical semiconductor layer 236*a* located on a relatively inner side may contact the first gate dielectric layer 142, and the remaining part of the upper surface and the remaining part of the lower surface of the vertical semiconductor layer 236*a* located on a relatively outer side may contact the insulating spacer 116.

The pair of source/drain contacts 120*a* may be on both sides of the gate line 150 with one gate line 150 therebetween on the fin-type active region FA. The source/drain contact 120*a* may include the first metal layer 122*a* and the second metal layer 124*a*. A portion of the first metal layer 122*a* may protrude in the first horizontal direction (X direction) toward the vertical semiconductor layer 236*a*. The protruding portion may have a horizontal width less than that of the insulating spacer 116 in the first horizontal direction (X direction).

Referring to FIG. 9, in areas where the plurality of fin-type active regions FA and the plurality of gate lines 150 cross each other, the semiconductor device 200*b* may include a plurality of horizontal semiconductor layers 232*b* respectively on upper portions of the plurality of fin-type active regions FA and a pair of vertical semiconductor layers 236*b* on both sides of the horizontal semiconductor layer 232*b* in the first horizontal direction (X direction) with the horizontal semiconductor layer 232*b* disposed therebetween.

In some embodiments, the vertical semiconductor layer 236*b* may extend in the first horizontal direction (X direction) such that an outer wall of the insulating spacer 116 and an outer wall of the vertical semiconductor layer 236*b* overlap in the vertical direction (Z direction). Accordingly, the vertical semiconductor layer 236*b* may include a portion that overlaps the entirety of the insulating spacer 116 in the vertical direction (Z direction).

In some embodiments, upper and lower surfaces of the vertical semiconductor layer 236*b* may contact the insulating spacer 116. For example, a part of the upper surface and a part of the lower surface of the vertical semiconductor layer 236*b* located on a relatively inner side may contact the first gate dielectric layer 142, and the remaining part of the upper surface and the remaining part of the lower surface of the vertical semiconductor layer 236*b* located on a relatively outer side may contact the insulating spacer 116.

The pair of source/drain contacts 120*b* may be on both sides of the gate line 150 in the first horizontal direction (X direction) with one gate line 150 therebetween on the fin-type active region FA. The source/drain contact 120*b* may include the first metal layer 122*b* and the second metal layer 124*b*. The first metal layer 122*b* may contact an outer wall of the vertical semiconductor layer 236*b* on a sidewall thereof. The first metal layer 122*b* may not include a protruding portion.

Figure 10:
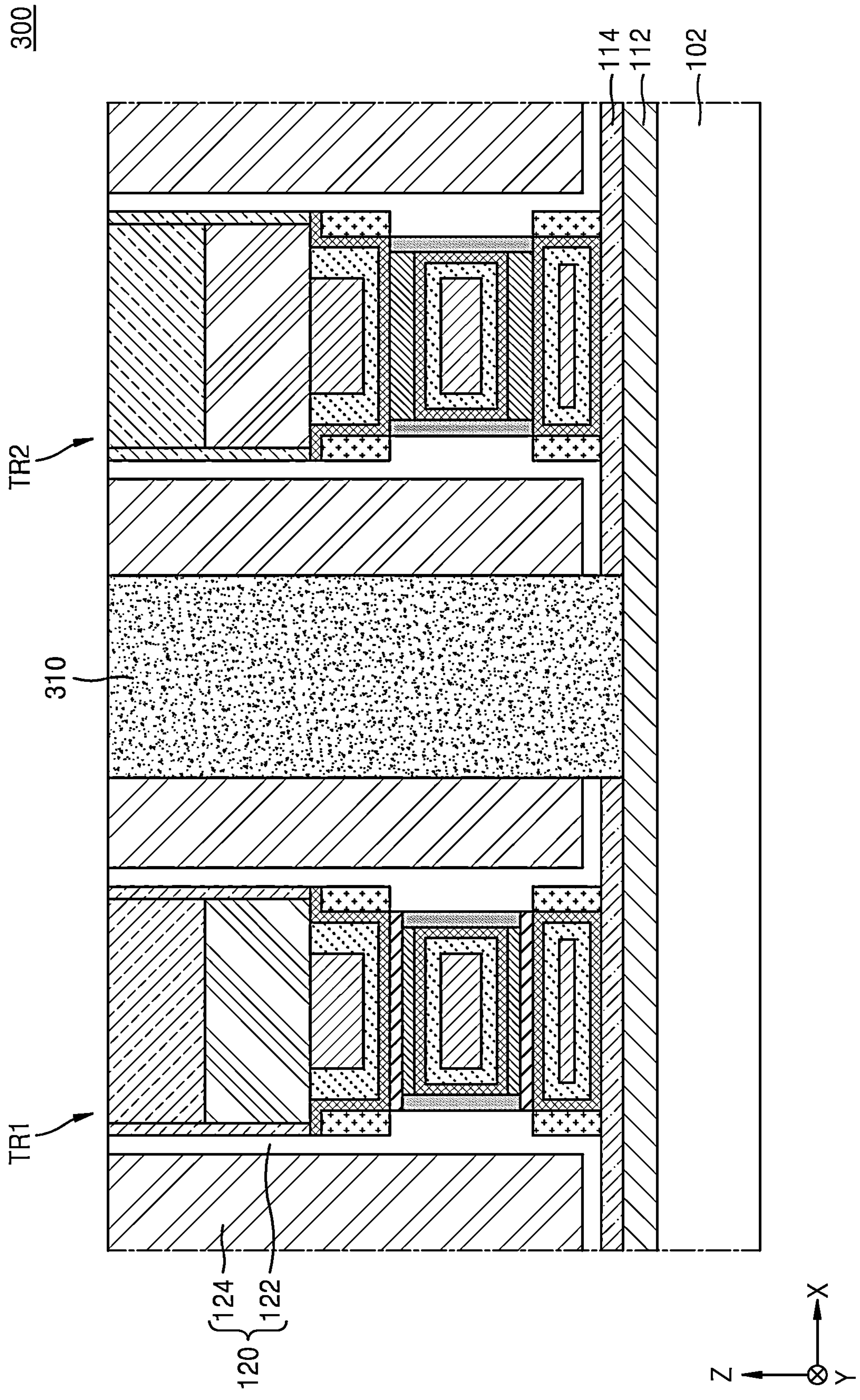
FIG. 10 is a cross-sectional view showing a semiconductor device according to some embodiments.

FIG. 10 is a cross-sectional view showing a semiconductor device 300 according to some embodiments.

Referring to FIG. 10, the semiconductor device 300 may include the plurality of transistors TR1 and TR2. The plurality of transistors TR1 and TR2 may be formed on the substrate 102. The etch stop layer 112 and the lower insulating layer 114 may be formed between the plurality of transistors TR1 and TR2 and the substrate 102. The plurality of transistors TR1 and TR2 may include the first transistor TR1 and the second transistor TR2. The first transistor TR1 and the second transistor TR2 may be arranged in the first horizontal direction (X direction). The first transistor TR1 and the second transistor TR2 may be spaced apart from each other with an inter-gate insulating layer 310 therebetween. The inter-gate insulating layer 310 may include, for example, a silicon nitride layer, a silicon oxide layer, or a combination thereof. The first transistor TR1 may be any one of the semiconductor device 100 described with reference to FIGS. 1 and 3, the semiconductor device 100*a* described with reference to FIG. 4, and the semiconductor device 100*b* described with reference to FIG. 5. The second transistor TR2 may be any one of the semiconductor device 200 described with reference to FIGS. 6 and 7, the semiconductor device 200*a* described with reference to FIG. 8, and the semiconductor device 200*b* described with reference to FIG. 9. However, the present disclosure is not limited thereto, and each of the first transistor TR1 and the second transistor TR2 may be any one of, for example, the semiconductor device 100 described with reference to FIGS. 1 and 3, the semiconductor device 100*a* described with reference to FIG. 4, and the semiconductor device 100*b* described with reference to FIG. 5.

Figure 11:
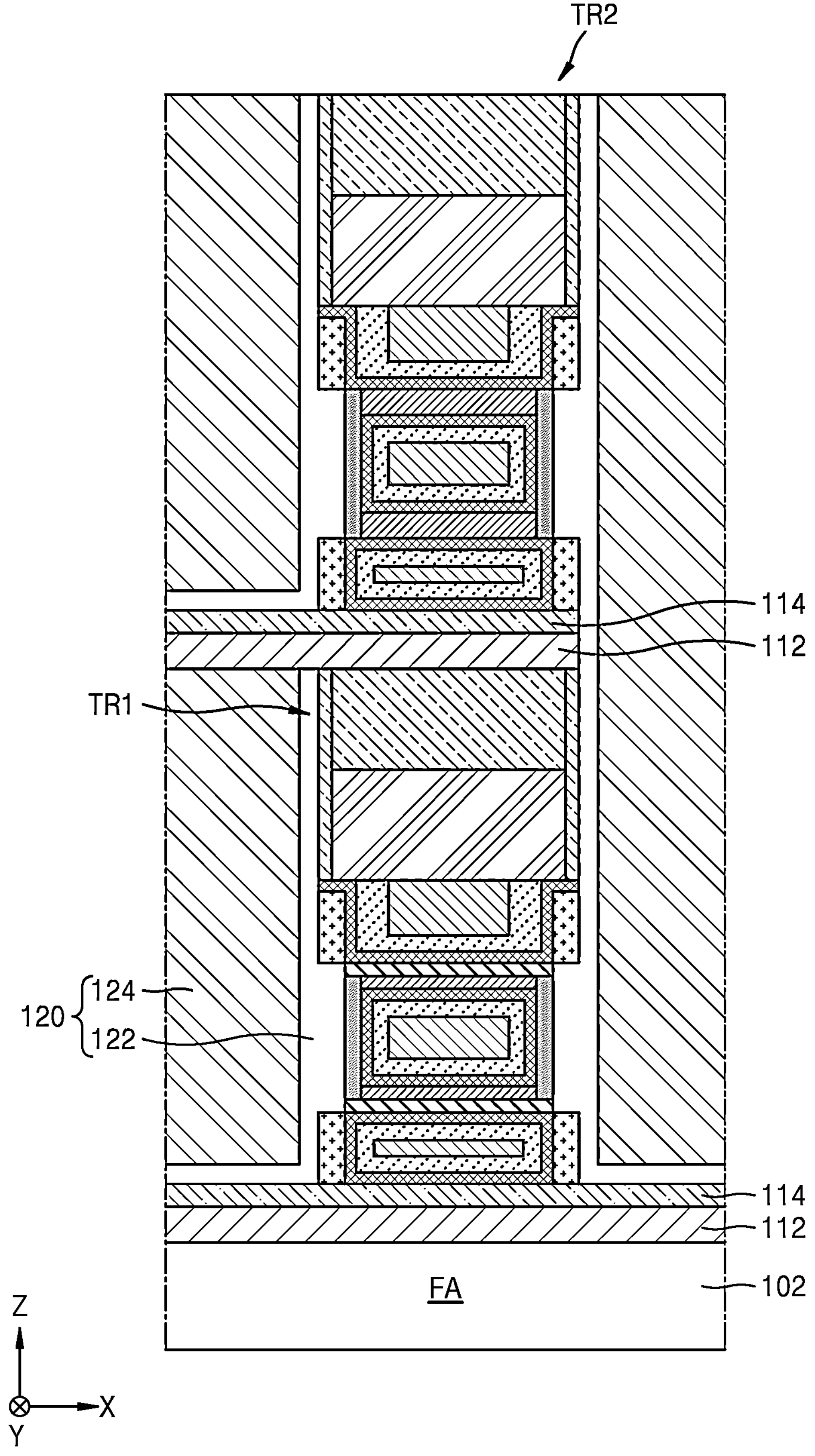
FIG. 11 is a cross-sectional view showing a semiconductor device according to some embodiments.

FIG. 11 is a cross-sectional view showing a semiconductor device 400 according to some embodiments.

Referring to FIG. 11, the semiconductor device 400 may include the plurality of transistors TR1 and TR2. The plurality of transistors TR1 and TR2 may include the first transistor TR1 and the second transistor TR2. The first transistor TR1 may be formed on the substrate 102. The etch stop layer 112 and the lower insulating layer 114 may be formed between the first transistor TR1 and the substrate 102. The second transistor TR2 may be stacked on the first transistor TR1 in the vertical direction (Z direction). The first transistor TR1 and the second transistor TR2 may be spaced apart from each other in the vertical direction (Z direction) with the etch stop layer 112 and the lower insulating layer 114 disposed therebetween. The source/drain contact 120 extending in length in the vertical direction (Z direction) may be on one side of each of the first transistor TR1 and the second transistor TR2. The source/drain contact 120 extending in length in the vertical direction (Z direction) may simultaneously contact the first transistor TR1 and the second transistor TR2. The first transistor TR1 may be any one of the semiconductor device 100 described with reference to FIGS. 1 and 3, the semiconductor device 100*a* described with reference to FIG. 4, and the semiconductor device 100*b* described with reference to FIG. 5. The second transistor TR2 may be any one of the semiconductor device 200 described with reference to FIGS. 6 and 7, the semiconductor device 200*a* described with reference to FIG. 8, and the semiconductor device 200*b* described with reference to FIG. 9. However, the present disclosure is not limited thereto, and each of the first transistor TR1 and the second transistor TR2 may be any one of, for example, the semiconductor device 100 described with reference to FIGS. 1 and 3, the semiconductor device 100*a* described with reference to FIG. 4, and the semiconductor device 100*b* described with reference to FIG. 5.

FIGS. 12, 13A, 13B, 14, 15, 16, 17, 18, 19A, 19B, 20A, 20B, 21A, 21B, 22A, 22B, 23, 24, 25, 26, 27A, 27B, 28A, 28B, 29A, 29B, 30A, 30B, 31A, and 31B are cross-sectional views for explaining a method of manufacturing the semiconductor device 100 according to some embodiments. Specifically, FIGS. 12, 13A, 14, 15, 16, 17, 18, 19A, 20A, 21A, 22A, 23, 24, 25, 26, 27A, 28A, 29A, 30A, and 31A are cross-sectional views sequentially showing the semiconductor device 100 taken along the line A-A' in FIG. 1, and FIGS. 13B, 19B, 20B, 21B, 22B, 27B, 28B, 29B, 30B, and 31B are cross-sectional views sequentially showing the semiconductor device 100 taken along the line B-B' in FIG. 1. In FIGS. 12 to 31B, the same reference numerals as in FIGS. 1 to 3 denote the same members, and thus, detailed descriptions thereof may be omitted herein.

Figure 12:
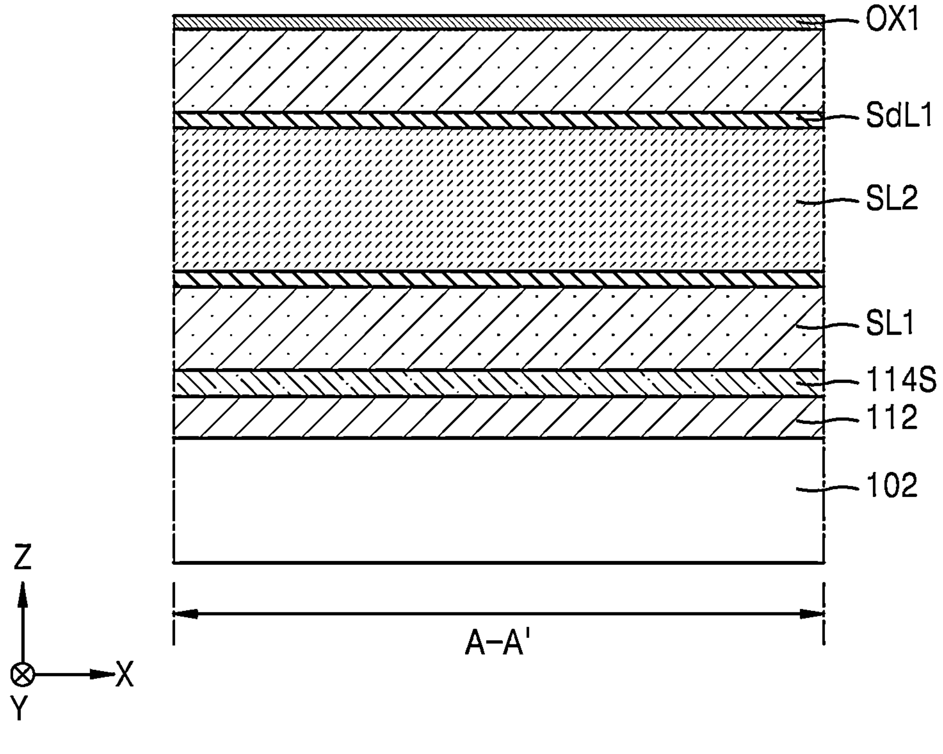
FIGS. 12, 13A, 13B, 14, 15, 16, 17, 18, 19A, 19B, 20A, 20B, 21A, 21B, 22A, 22B, 23, 24, 25, 26, 27A, 27B, 28A, 28B, 29A, 29B, 30A, 30B, 31A, and 31B are cross-sectional views for explaining a method of manufacturing a semiconductor device according to some embodiments.

Referring to FIG. 12, the etch stop layer 112 and a lower insulating material layer 114S are sequentially formed on the substrate 102. Next, a first sacrificial layer SL1, a first seed material layer SdL1, a second sacrificial layer SL2, and a first oxide layer OX1 may be sequentially formed on the lower insulating material layer 114S. Next, the plurality of fin-type active regions FA may be defined on the substrate 102 by etching a part of each of the first sacrificial layer SL1, the first seed material layer SdL1, the second sacrificial layer SL2, the etch stop layer 112, the lower insulating material layer 114S, and the substrate 102. Next, a device isolation layer (not shown) may be formed to cover a sidewall of each of the plurality of fin-type active regions FA.

In some embodiments, the first sacrificial layer SL1 may include a semiconductor material. For example, the first sacrificial layer SL1 may include a Si layer. In some embodiments, the second sacrificial layer SL2 may include a metal oxide layer. For example, the second sacrificial layer SL2 may include an aluminum oxide layer. In some embodiments, the first seed material layer SdL1 may include an oxide of transition metal or a catalyst of the transition metal oxide. For example, the seed material layer SdL1 may include an oxide of transition metal such as $MoO_4$ or $WO_3$ or a catalyst of the transition metal oxide such as $Na_2MoO_4$ or $K_2MoO_4$.

Figure 13A:
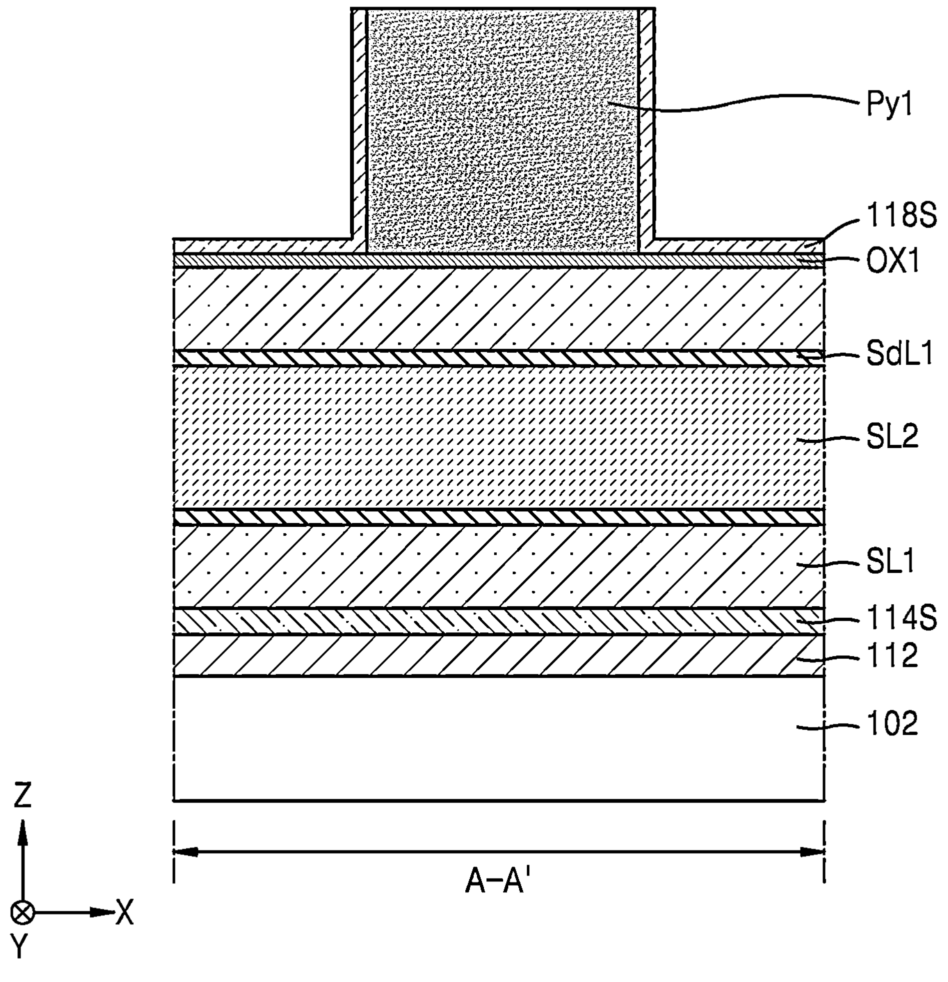
Figure 13B:
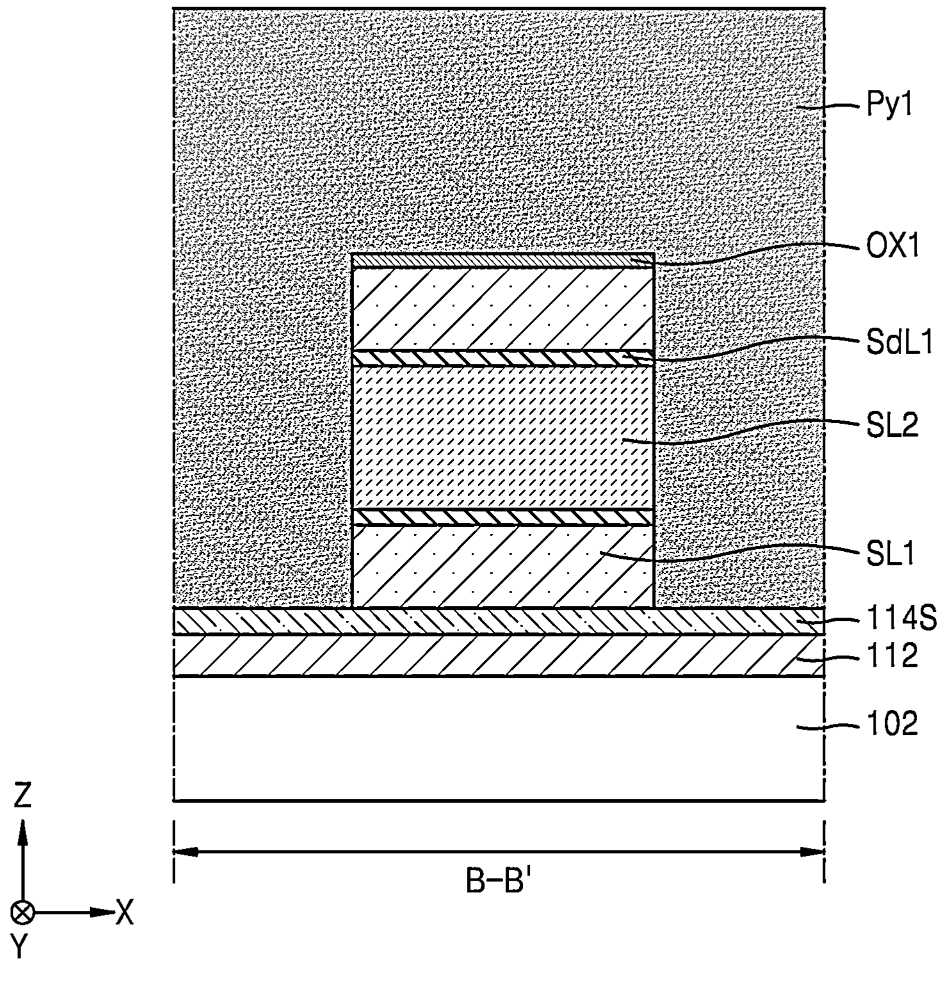

Referring to FIGS. 13A and 13B, in a result of FIG. 12, a dummy gate layer Py1 may be formed on a first oxide layer OX1, and an insulating material layer 118S covering both sidewalls of the dummy gate layer Py1 and the first oxide layer Ox1 may be formed. In some embodiments, the dummy gate layer Py1 may include polysilicon, and the insulating material layer 118S may include a silicon nitride layer.

Figure 14:
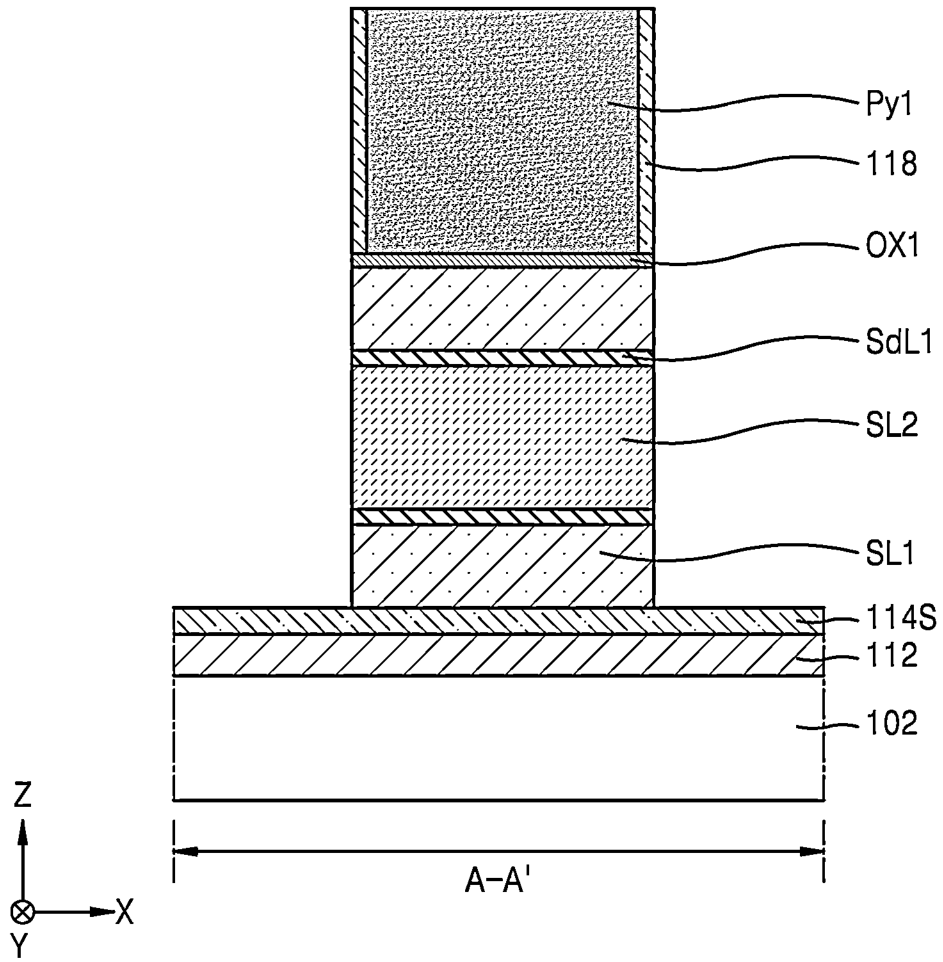

Referring to FIG. 14, in a result of FIGS. 13A and 13B, a part of each of the insulating material layer 118S, the first oxide layer OX1, and a first sacrificial layer SL1, the first seed material layer SdL1, and the second sacrificial layer SL2 may be etched by using the dummy gate layer Py1 as an etch mask. Through an etching process, a portion of the insulating material layer 118S covering an upper surface of the first oxide layer OX1 may be removed, and only a portion thereof covering both sidewalls of the dummy gate layer Py1 may remain and be defined as the insulating liner 118. The etching process may be performed by using, for example, dry etching, wet etching, or a combination thereof.

Figure 15:
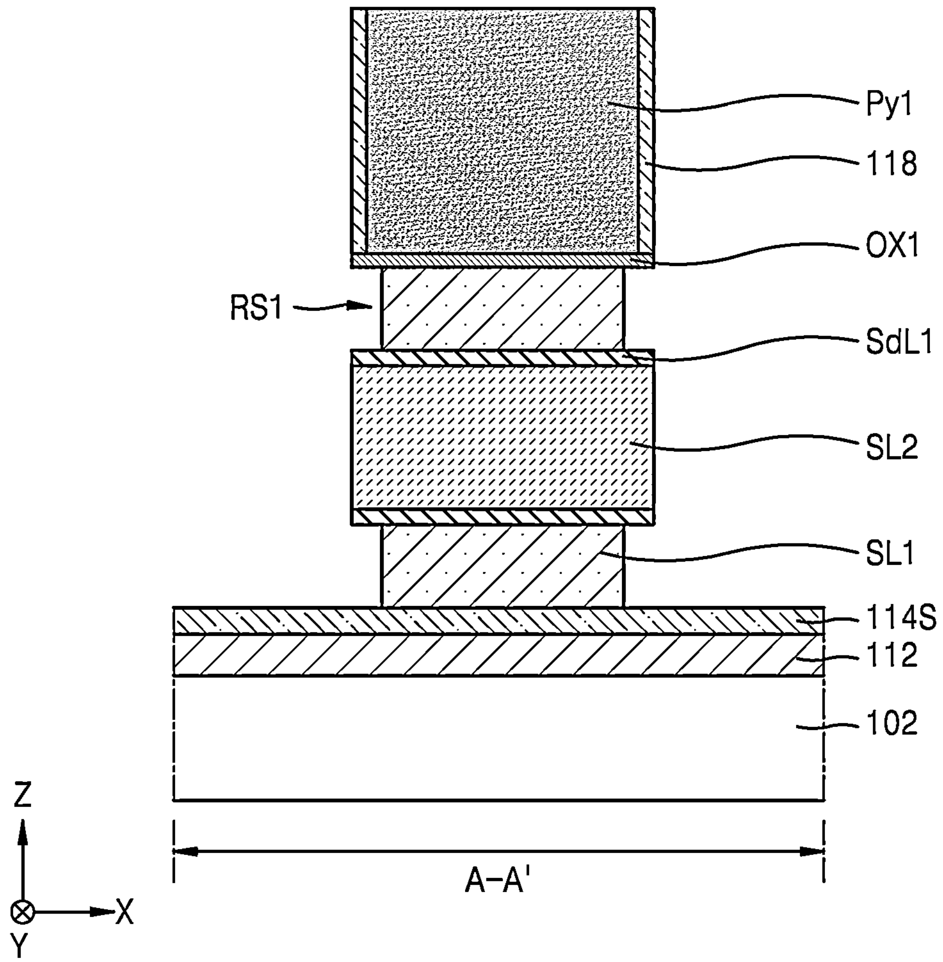

Referring to FIG. 15, in a result of FIG. 14, a first recess RS1 may be formed by etching a part of the first sacrificial layer SL1 in a horizontal direction. A part of an upper surface of the first seed material layer SdL1 located on a relatively upper side among the first seed material layers SdL1 and a part of a lower surface of the first seed material layer SdL1 located on a relatively lower side among the first seed material layers SdL1 may be exposed by the first recess RS1.

Figure 16:
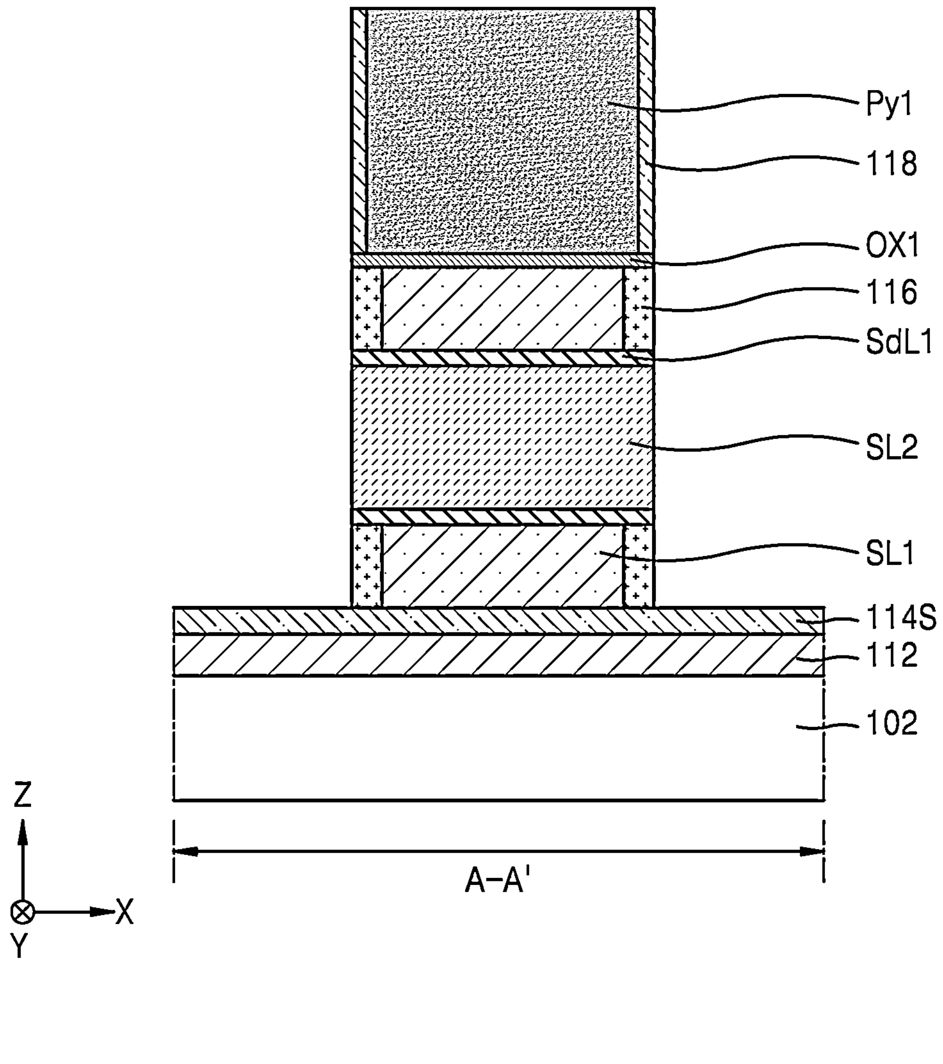

Referring to FIG. 16, in a result of FIG. 15, the insulating spacer 116 that is in and may fill the first recess RS1 (see FIG. 15) may be formed. The insulating spacer 116 may be formed by forming an insulating material layer that is in and may fill the first recess RS1 and that covers a sidewall of the first seed material layer SdL1, a sidewall of the second sacrificial layer SL2, a sidewall of the first oxide layer OX1, and a sidewall of the insulating liner 118, and then, removing the remaining portion of the insulating material layer except for a portion filling the first recess RS1. Accordingly, a length of the insulating spacer 116 in the first horizontal direction (X direction) may be substantially the same as a length of the first recess RS1 in the first horizontal direction (X direction).

Figure 17:
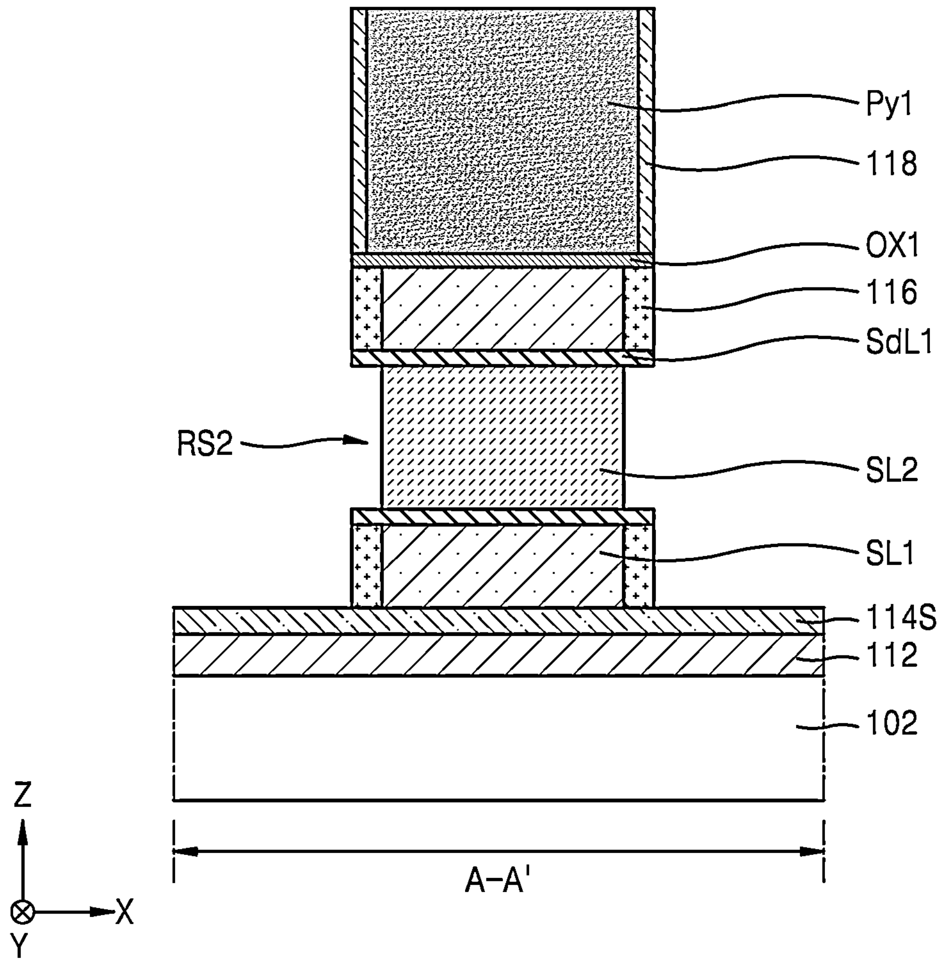

Referring to FIG. 17, in a result of FIG. 16, a second recess RS2 may be formed by etching a part of the second sacrificial layer SL2 in the horizontal direction. A part of the lower surface of the first seed material layer SdL1 located on the relatively upper side among the first seed material layers SdL1 and a part of the upper surface of the first seed material layer SdL1 located on the relatively lower side among the first seed material layers SdL1 may be exposed by the second recess R2.

In some embodiments, a length of the second recess RS2 in the first horizontal direction (X direction) may be substantially the same as a length of the first recess RS1 (see FIG. 15) in the first horizontal direction (X direction).

In some embodiments, the length of the second recess RS2 in the first horizontal direction (X direction) may be less than the length of the first recess RS1 (see FIG. 15) in the first horizontal direction (X direction). In this case, when compared to a case where the length of the second recess RS2 in the first horizontal direction (X direction) is the same as the length of the first recess RS1 (see FIG. 15) in the first horizontal direction (X direction), a second hole H2 (see FIG. 20A) formed in a process to be described below may have a larger size in the first horizontal direction (X direction), and a semiconductor layer 132S (see FIG. 21A) formed in the second hole H2 by using a second seed material layer SdL2 (see FIG. 20A) also may have a larger size in the first horizontal direction (X direction). As a result, a semiconductor device manufactured through a process to be described below may have substantially the same structure as that of the semiconductor device 100*a* described with reference to FIG. 4.

In some embodiments, a process of forming the second recess RS2 described with reference to FIG. 17 may be omitted. In this case, when compared to the case of forming the second recess RS2, the a second hole H2 (see FIG. 20A) formed in the process to be described below may have a larger size in the first horizontal direction (X direction), and the semiconductor layer 132S (see FIG. 21A) formed in the second hole H2 by using the second seed material layer SdL2 (sec FIG. 20A) also may have a larger size in the first horizontal direction (X direction). As a result, the semiconductor device manufactured through the process to be described below may have substantially the same structure as that of the semiconductor device 100*b* described with reference to FIG. 5.

Figure 18:
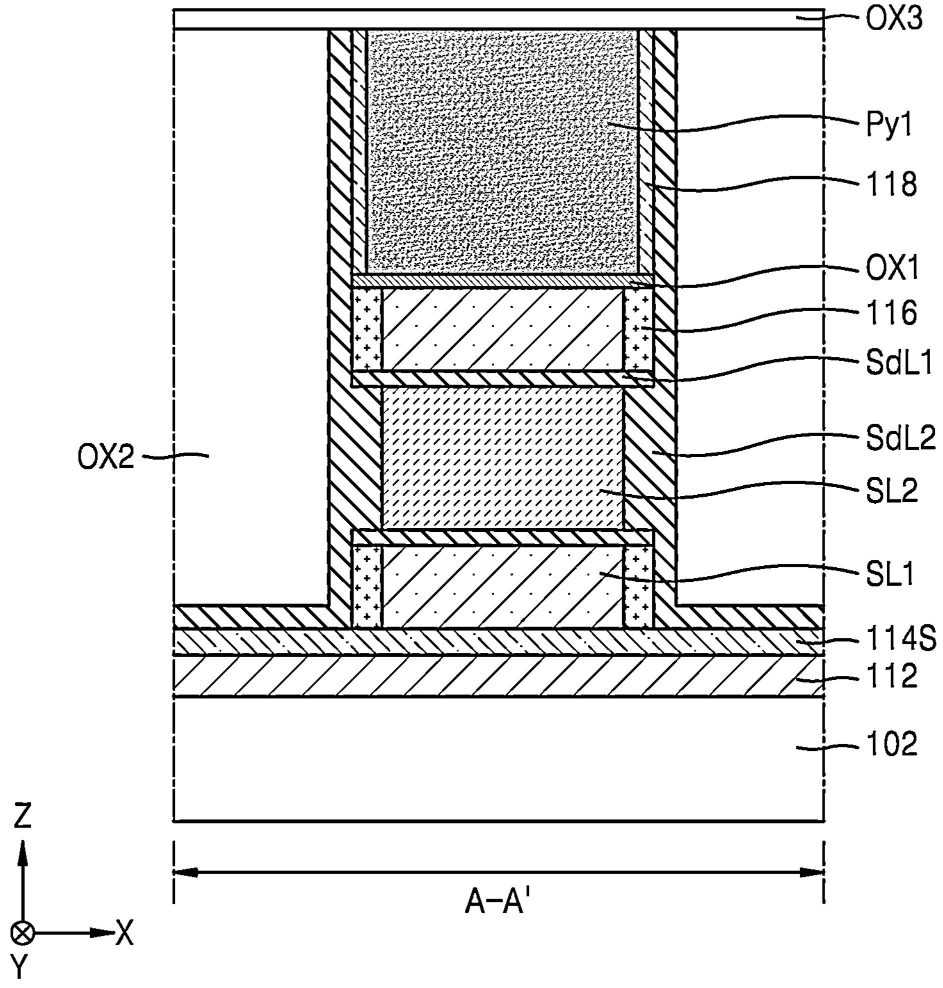

Referring to FIG. 18, in a result of FIG. 17, the second seed material layer SdL2 may be formed that is in and fills the second recess RS2 and covers the sidewall of the first seed material layer SdL1, the sidewall of the insulating spacer 116, the sidewall of the first oxide layer OX1, the sidewall of the insulating liner 118, and the upper surface of the lower insulating material layer 114S. Next, a second oxide layer OX2 may be formed that covers and conforms to a surface of the second seed material layer SdL2, and a third oxide layer OX3 may be formed that covers an upper surface of the second oxide layer OX2 and an upper surface of the dummy gate layer Py1.

In some embodiments, the second oxide layer OX2 and the third oxide layer OX3 may be formed of a silicon oxide layer. In some embodiments, the first seed material layer SdL1 and the second seed material layer SdL2 may include substantially the same material.

Figure 19A:
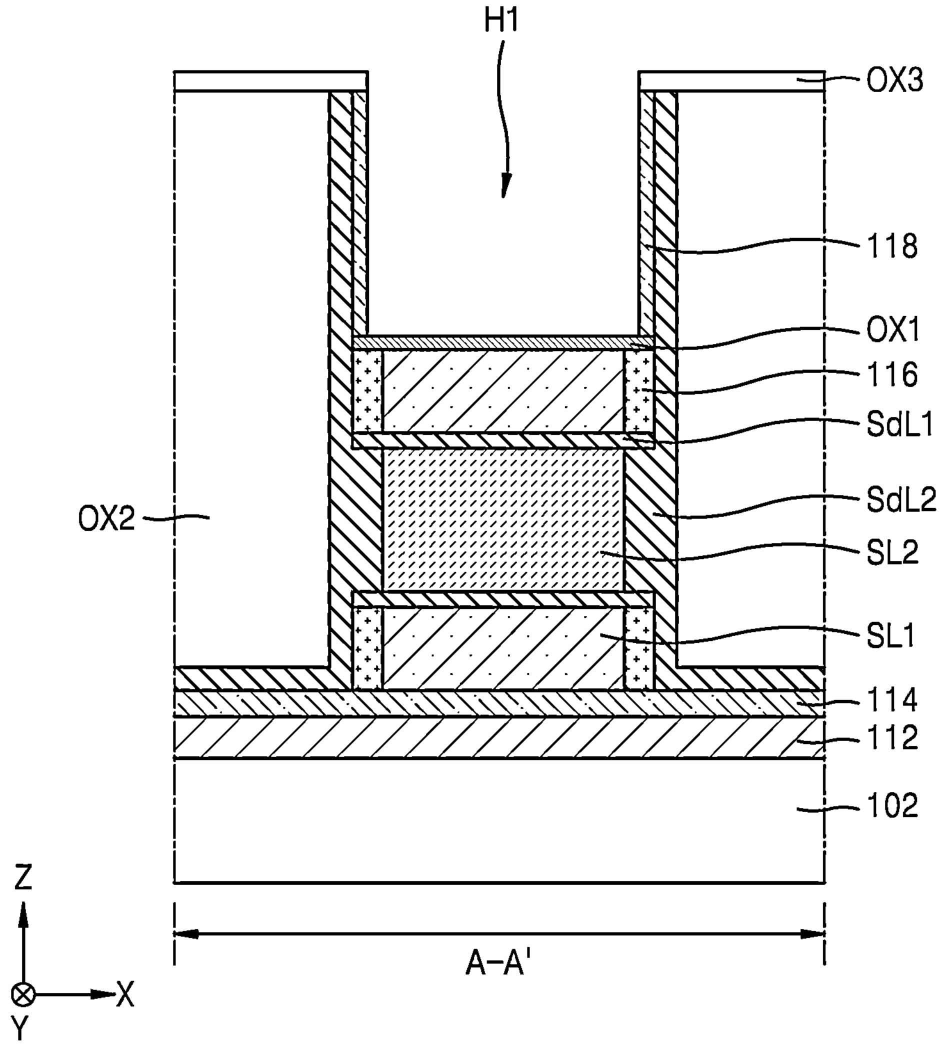
Figure 19B:
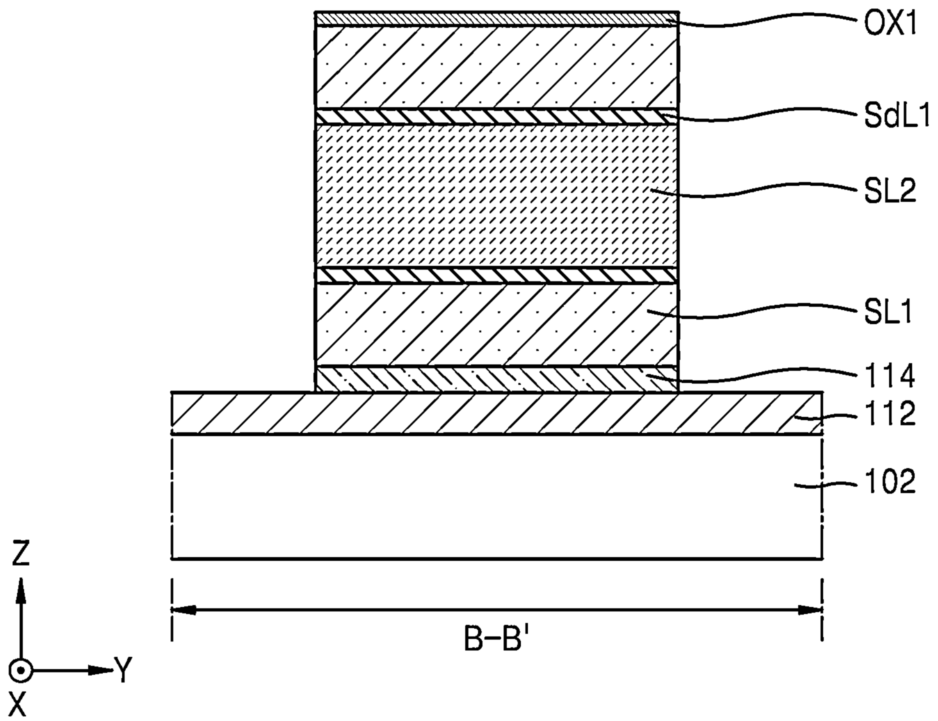

Referring to FIGS. 19A and 19B, in a result of FIG. 18, the upper surface of the dummy gate layer Py1 may be exposed by removing a part of the third oxide layer OX3 that overlaps the dummy gate layer Py1 in the vertical direction (Z direction). Next, a first hole H1 may be formed by removing the exposed dummy gate layer Py1. Next, a part of the lower insulating material layer 114S exposed through the first hole H1 may be removed. At this time, the remaining part of the lower insulating material layer 114S may be defined as the lower insulating layer 114.

Figure 20A:
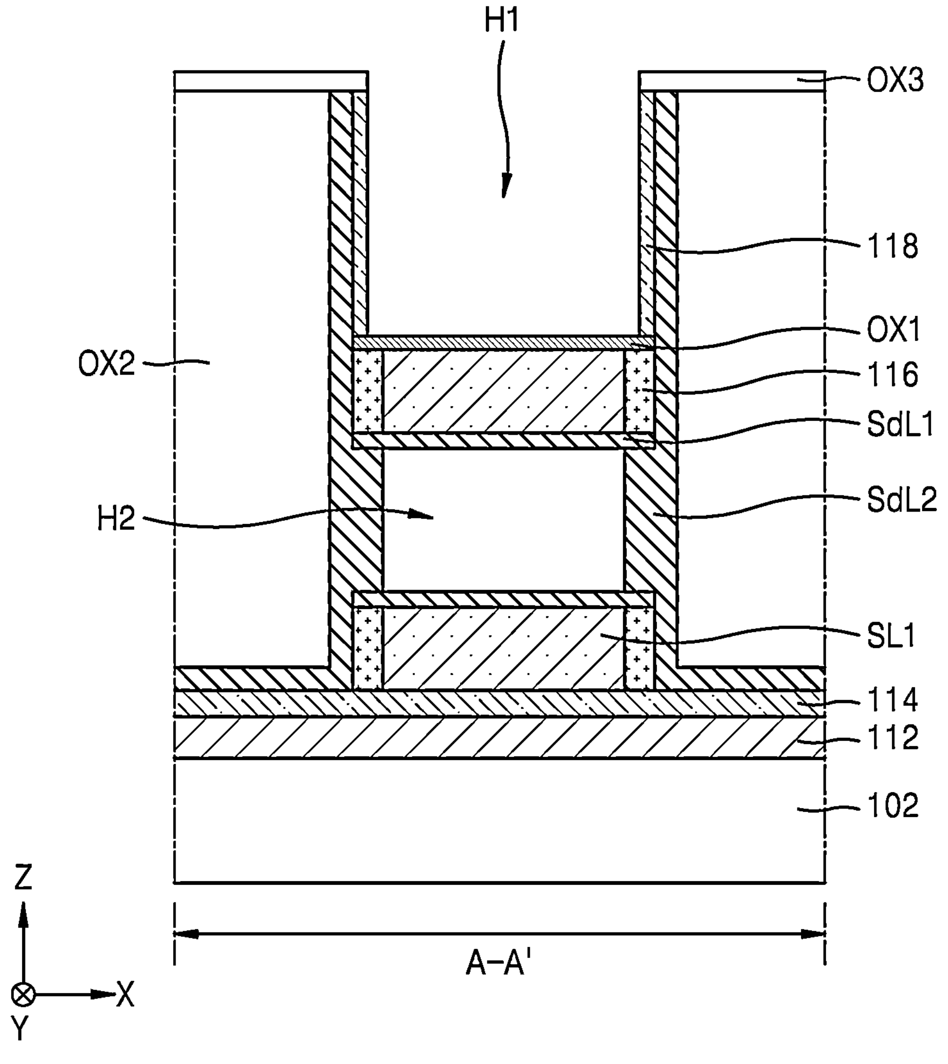
Figure 20B:
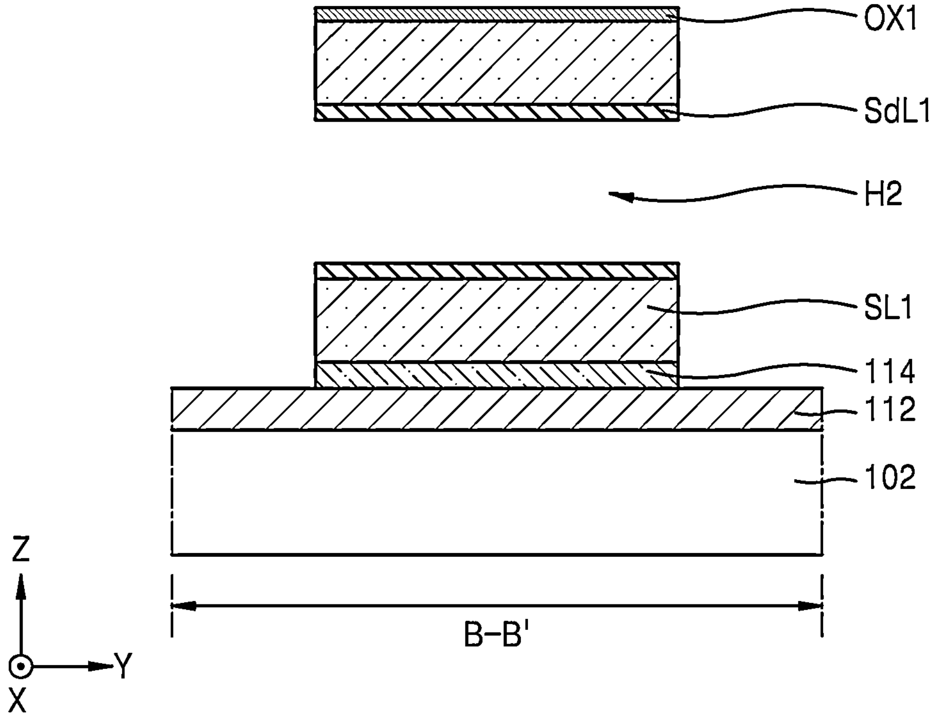

Referring to FIGS. 20A and 20B, in a result of FIGS. 19A and 19B, a second hole H2 may be formed by removing the second sacrificial layer SL2 exposed through the first hole H1. The first hole H1 and the second hole H2 may be communicatively connected to each other.

Figure 21A:
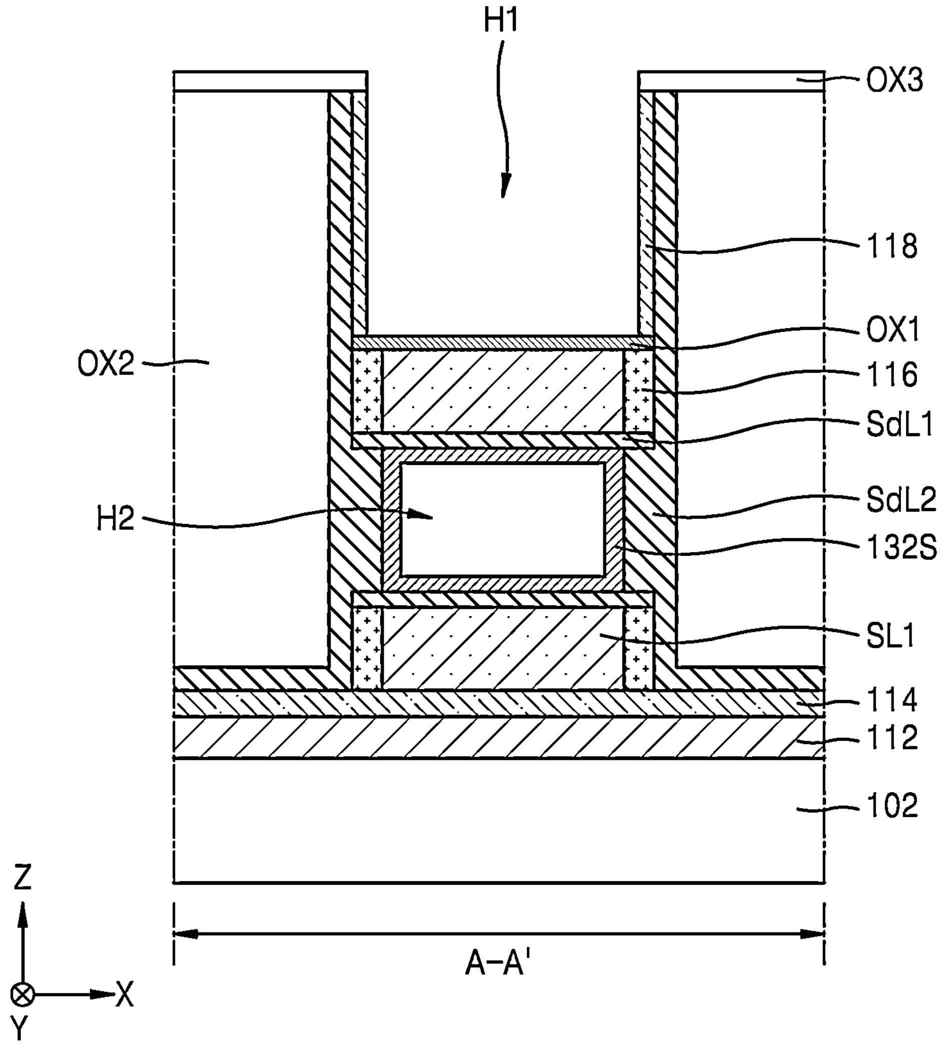
Figure 21B:
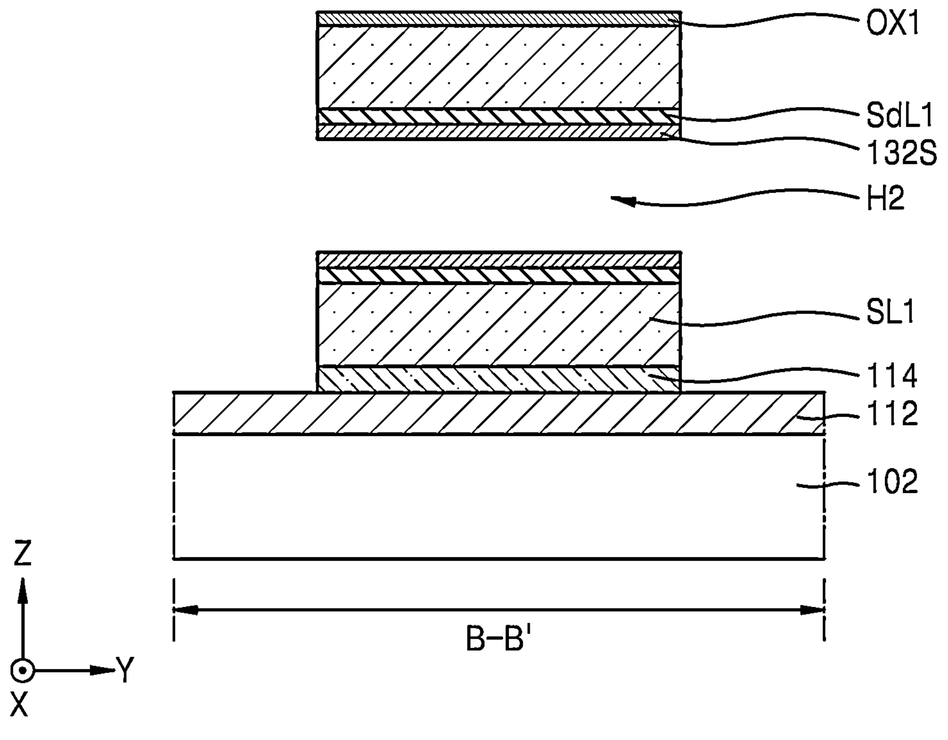

Referring to FIGS. 21A and 21B, in a result of FIGS. 20A and 20B, the semiconductor layer 132S may be formed. The semiconductor layer 132S may be formed inside the seed material layers SdL1 and SdL2 through an epitaxial growth process using the seed material layers SdL1 and SdL2.

Figure 22A:
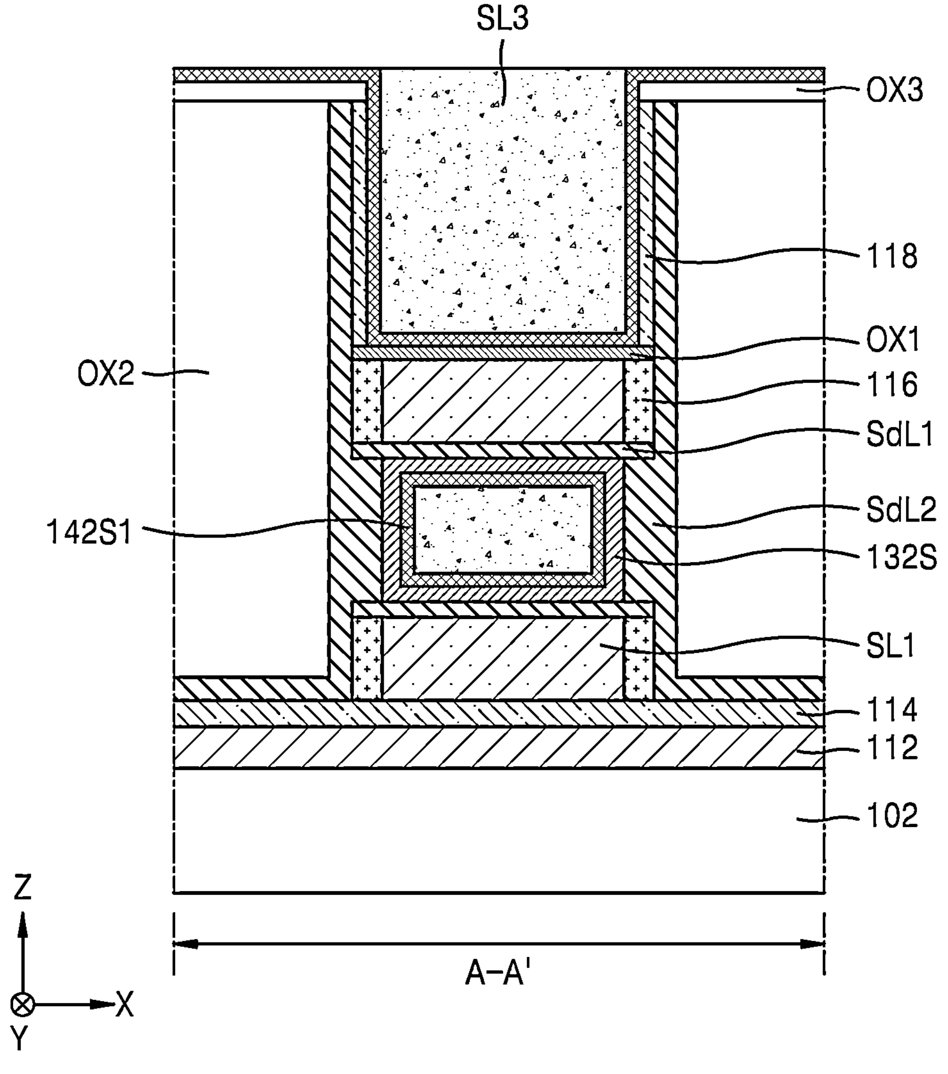
Figure 22B:
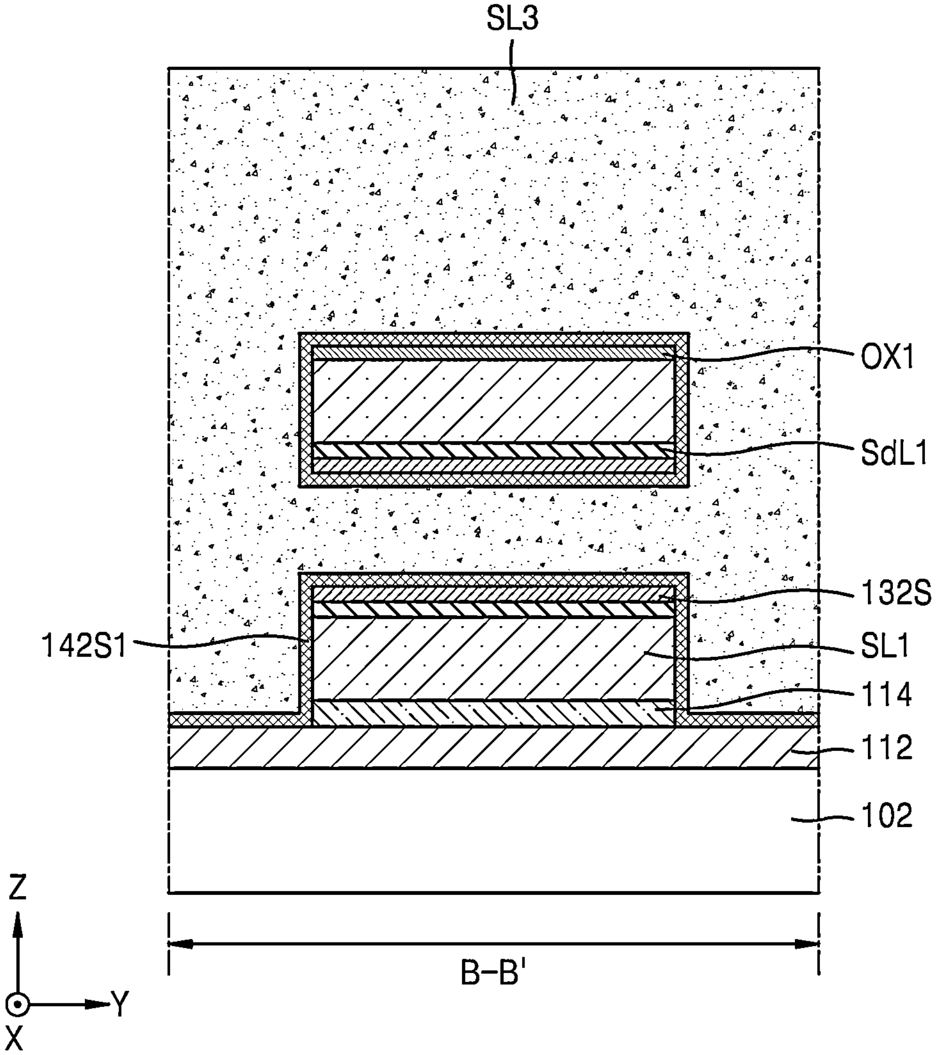

Referring to FIGS. 22A and 22B, in a result of FIGS. 21A and 21B, a dielectric material layer 142S1 may be formed that covers an exposed surface of each of the first oxide layer OX1, the first sacrificial layer SL1, the semiconductor layer 132S, the lower insulating layer 114, and the etch stop layer 112. In some embodiments, the dielectric material layer 142S1 may be formed by using an atomic layer deposition (ALD) process. Next, a third sacrificial layer SL3 may be formed that fills the first hole H1 and the second hole H2 and covers the upper surface of the third oxide layer OX3. In some embodiments, the third sacrificial layer SL3 may include, for example, metal oxide. In some embodiments, the third sacrificial layer SL3 may be formed by using an ALD process or a chemical vapor deposition (CVD) process.

Figure 23:
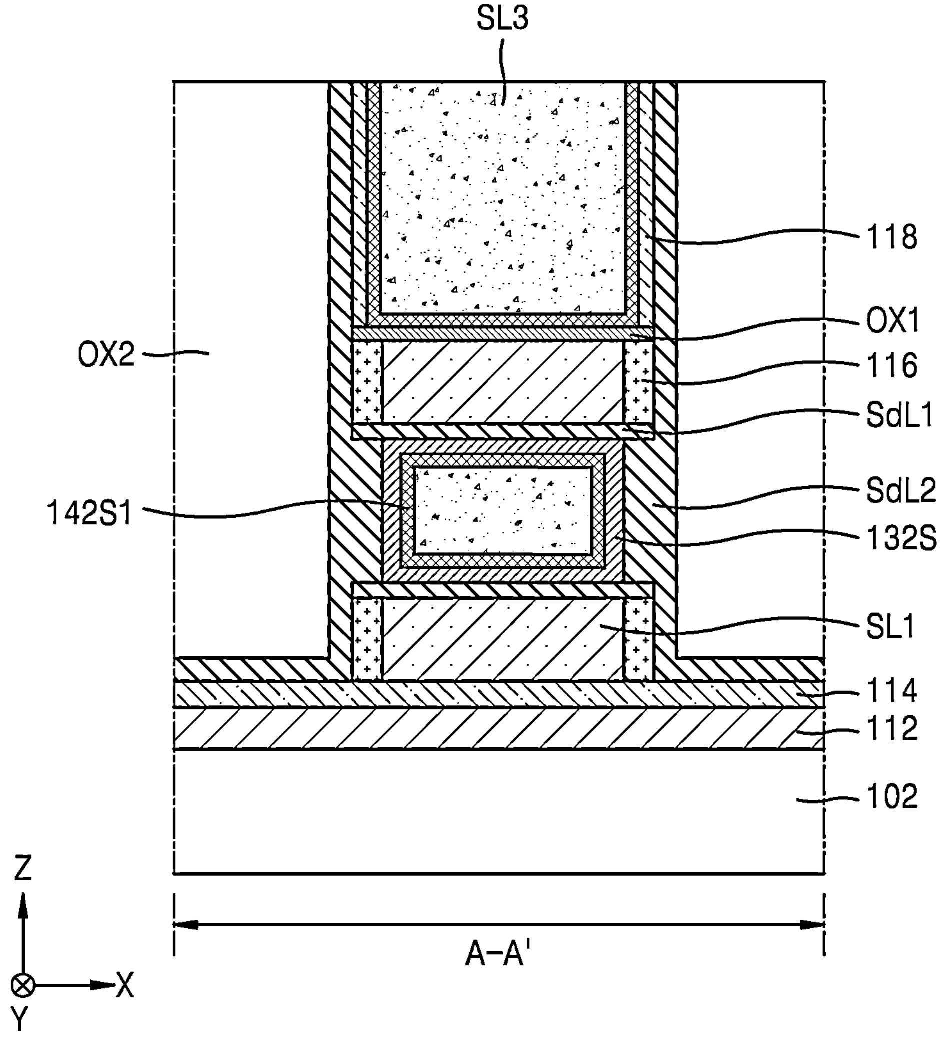

Referring to FIG. 23, in a result of FIGS. 22A and 22B, a part of the dielectric material layer 142S1, a part of the third oxide layer OX3, and a part of the third sacrificial layer SL3 may be removed. Accordingly, an upper surface of the third sacrificial layer SL3, the upper surface of the insulating liner 118, and the upper surface of the second oxide layer OX2 may be coplanar.

Figure 24:
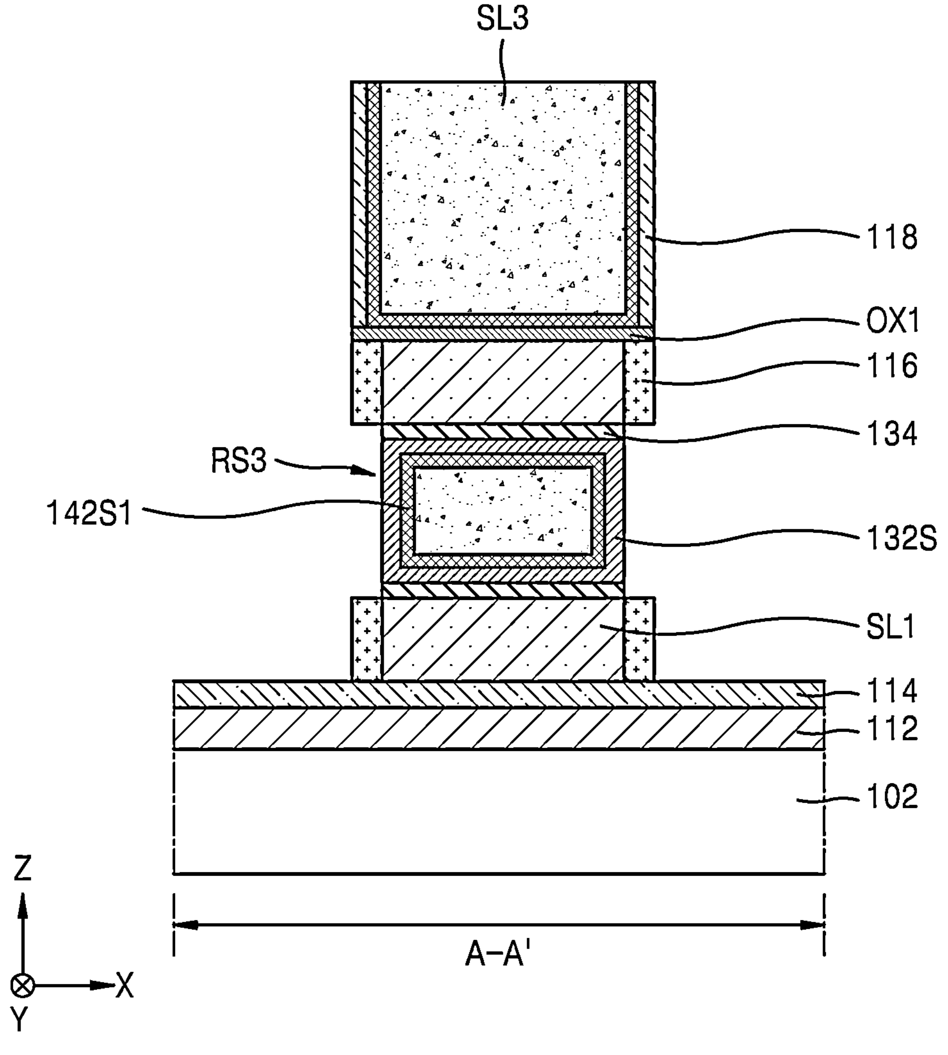

Referring to FIG. 24, the second oxide layer OX2 may be removed from a result of FIG. 23. Next, a third recess RS3 may be formed by sequentially removing parts of the second seed material layer SdL2 and the first seed material layer SdL1 exposed by removing the second oxide layer OX2. At this time, the remaining part of the first seed material layer SdL1 that has not been removed may be defined as the seed layer 134. The third recess RS3 may expose a part of the surface of the semiconductor layer 132S.

Figure 25:
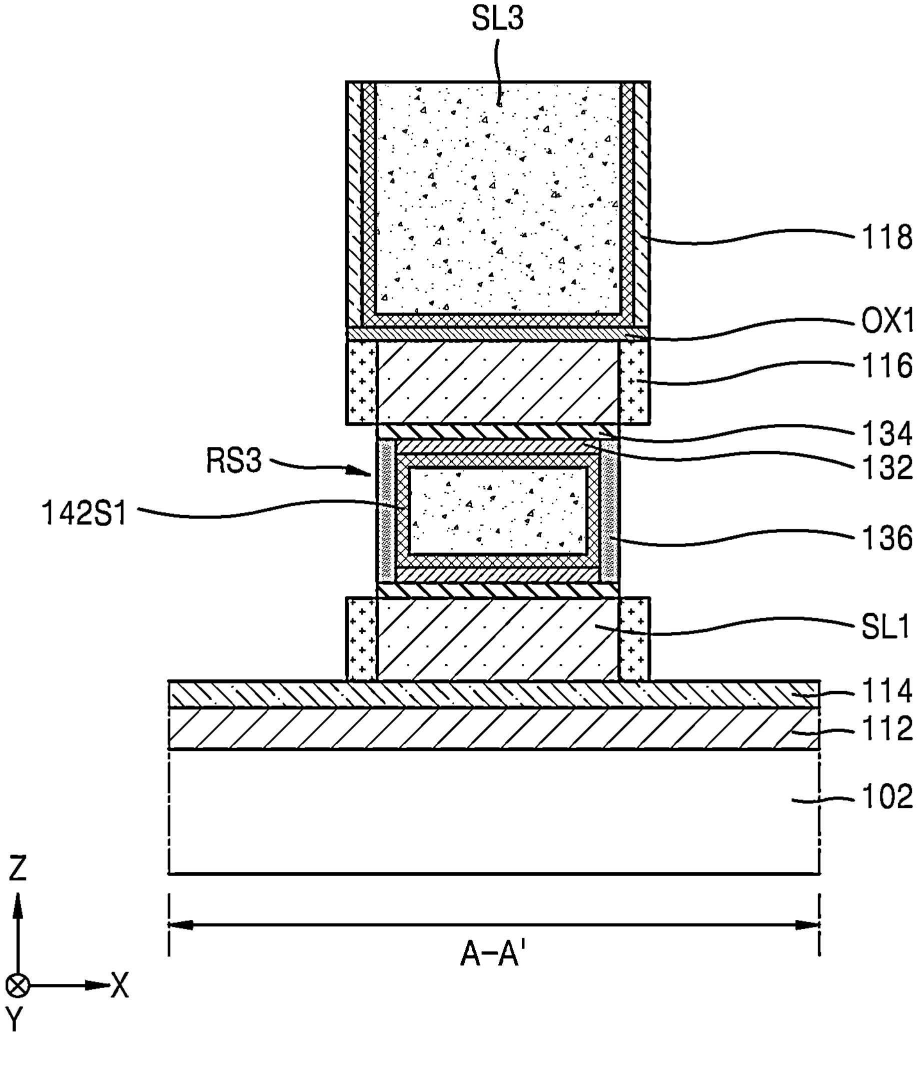

Referring to FIG. 25, in a result of FIG. 24, a part of the semiconductor layer 132S (see FIG. 24) exposed through the third recess RS3 may be doped with impurities. In some embodiments, the impurities may be p-type impurities or n-type impurities. The p-type impurities may be, for example, boron, and the n-type impurities may be, for example, phosphorus. In some embodiments, a concentration of the doped impurities may be from about $10^{18}/cm^3$ to about $10^{21}/cm^3$. In some embodiments, doping of the impurities may be performed by using a plasma process. After doping of the impurities is performed, a portion of the semiconductor layer 132S that is not doped with the impurities may be defined as the horizontal semiconductor layer 132, and a portion of the semiconductor layer 132S that is doped with the impurities may be defined as the vertical semiconductor layer 136.

Figure 26:
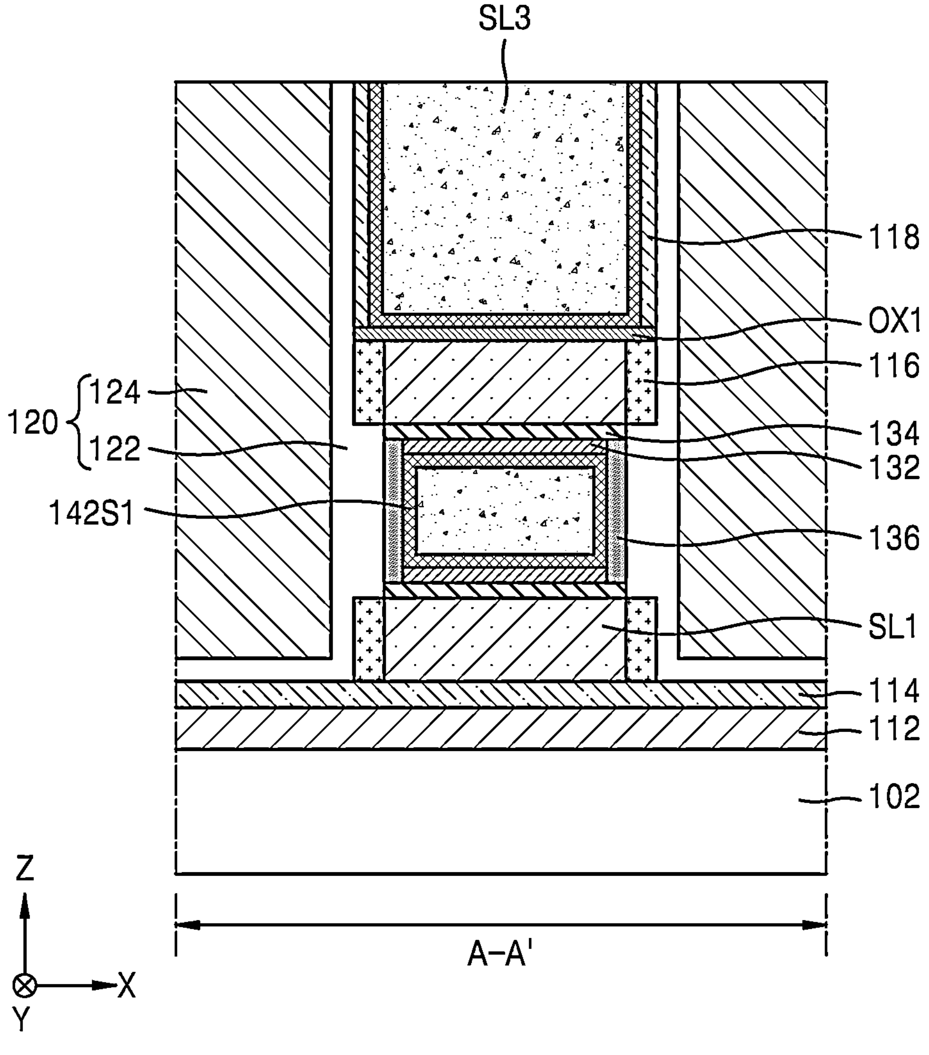

Referring to FIG. 26, in a result of FIG. 25, the source/drain contact 120 contacting the vertical semiconductor layer 136 may be formed. The source/drain contact 120 may be formed by forming the first metal layer 122 that conforms to the exposed surface of each of the insulating liner 118, the first oxide layer OX1, the insulating spacer 116, the vertical semiconductor layer 136, and the lower insulating layer 114, and then, forming the second metal layer 124 that covers an exposed surface of the first metal layer 122. The first metal layer 122 and the second metal layer 124 may be formed by using, for example, the ALD process or the CVD process.

Figure 27A:
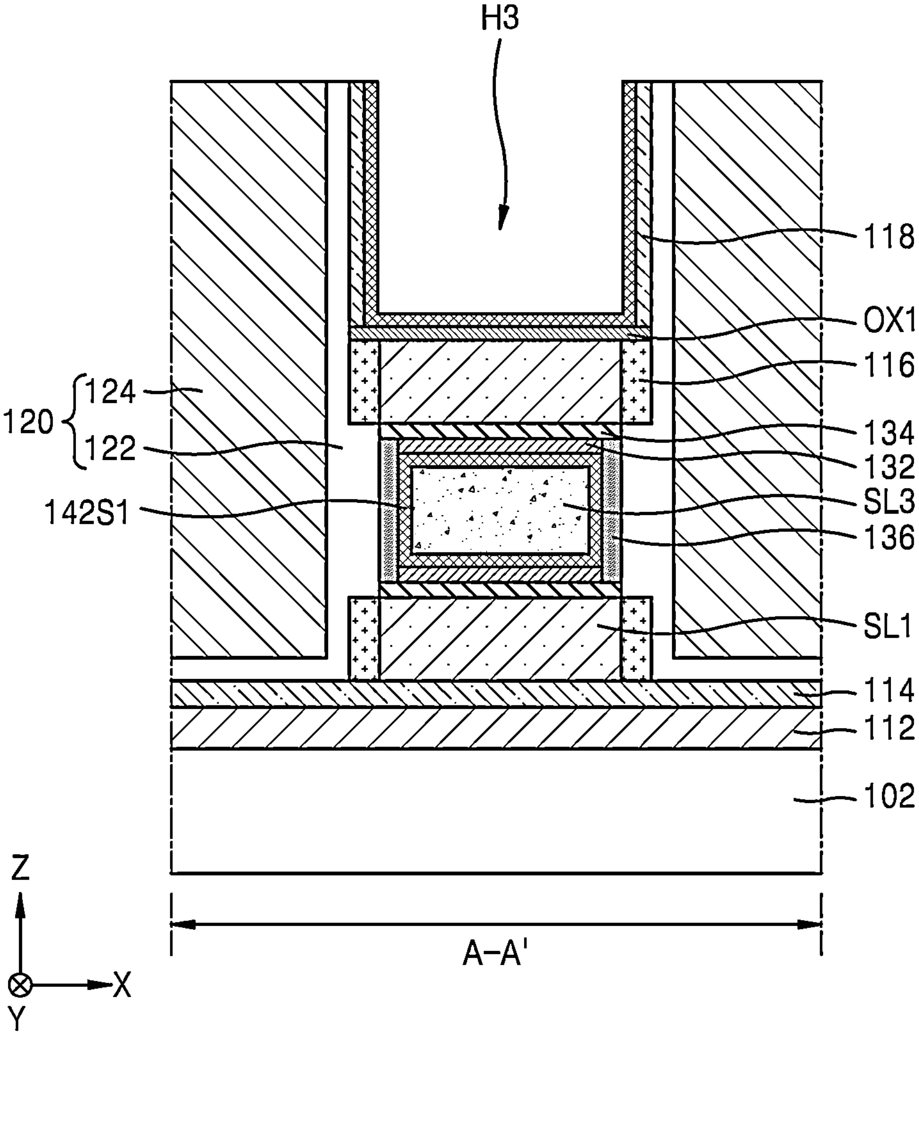
Figure 27B:
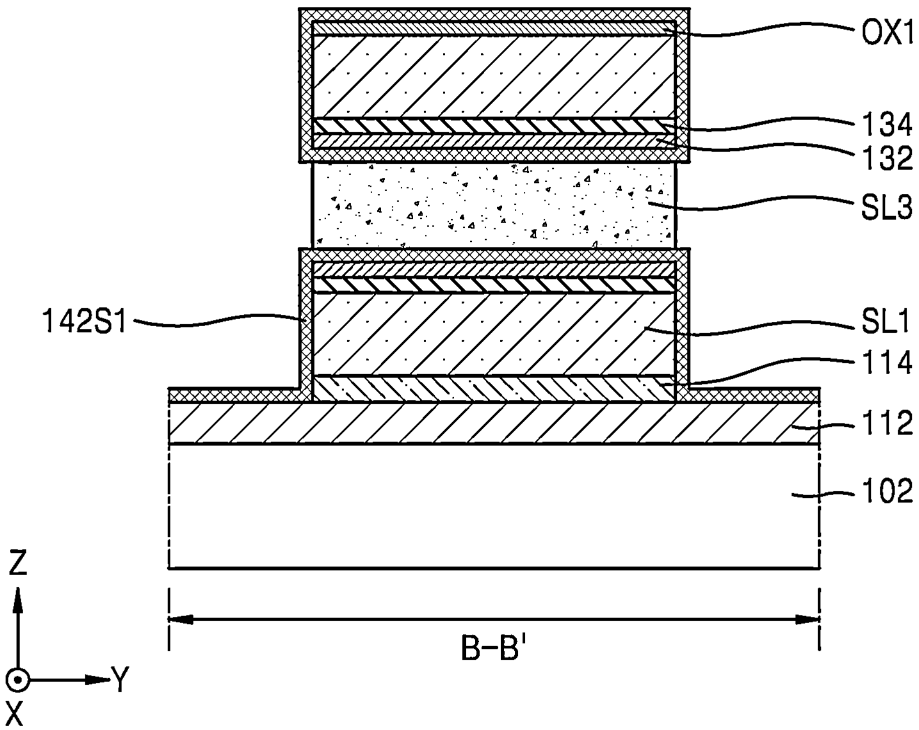

Referring to FIGS. 27A and 27B, in a result of FIG. 26, a third hole H3 may be formed by removing a part of the third sacrificial layer SL3.

Figure 28A:
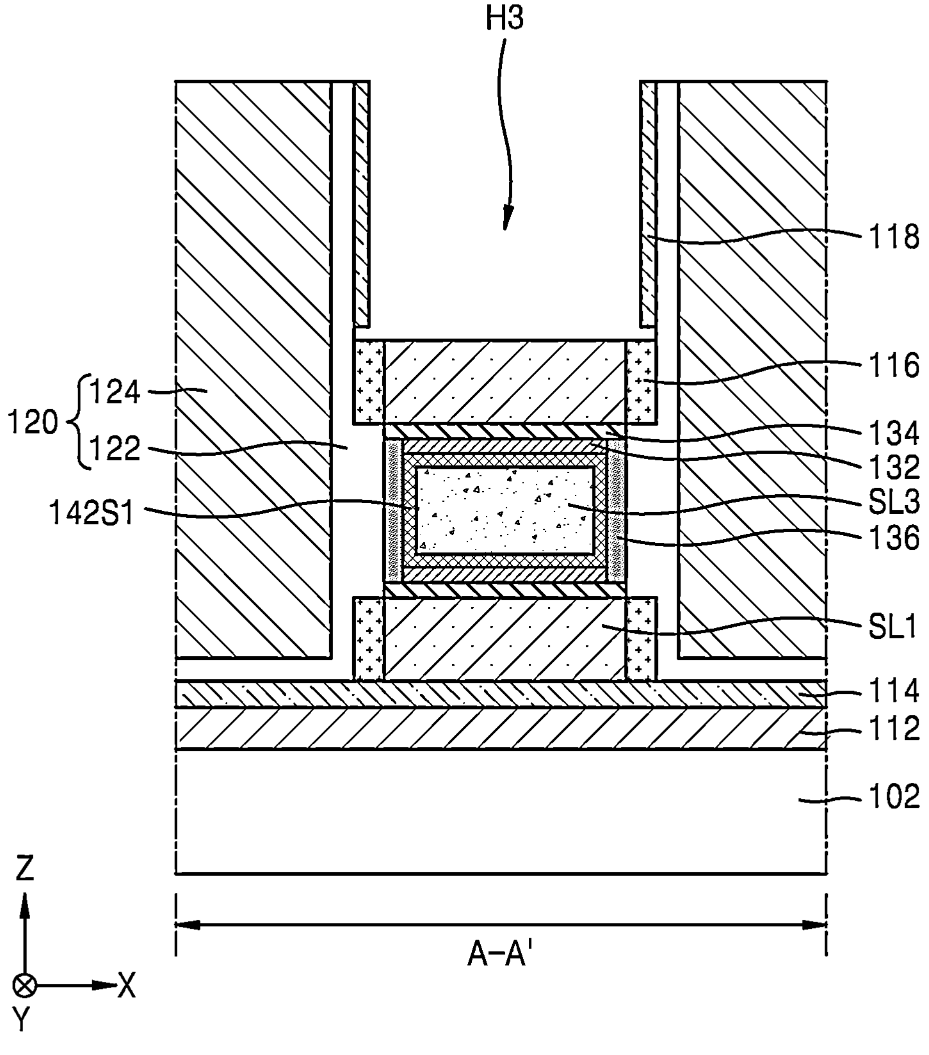
Figure 28B:
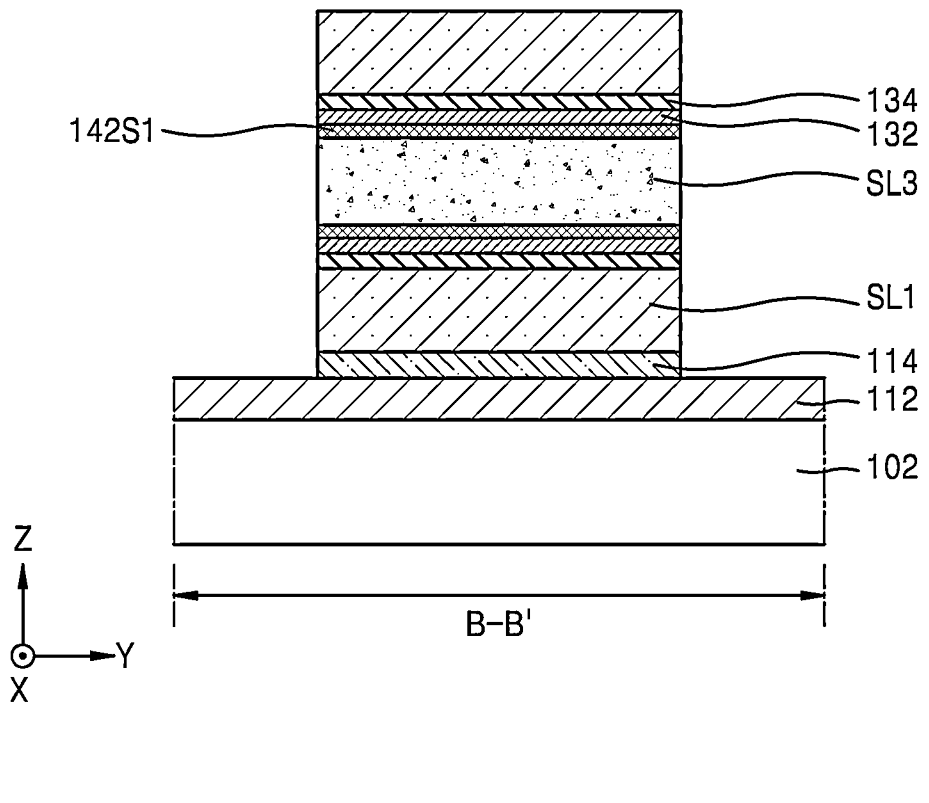

Referring to FIGS. 28A and 28B, in a result of FIGS. 27A and 27B, a part of the dielectric material layer 142S1 exposed through the third hole H3 may be removed, and the first oxide layer OX1 (see FIG. 27A) exposed by the removed part of the dielectric material layer 142S1 may be removed. The third hole H3 may be expanded by removing the part of the dielectric material layer 142S1 and the first oxide layer OX1.

Figure 29A:
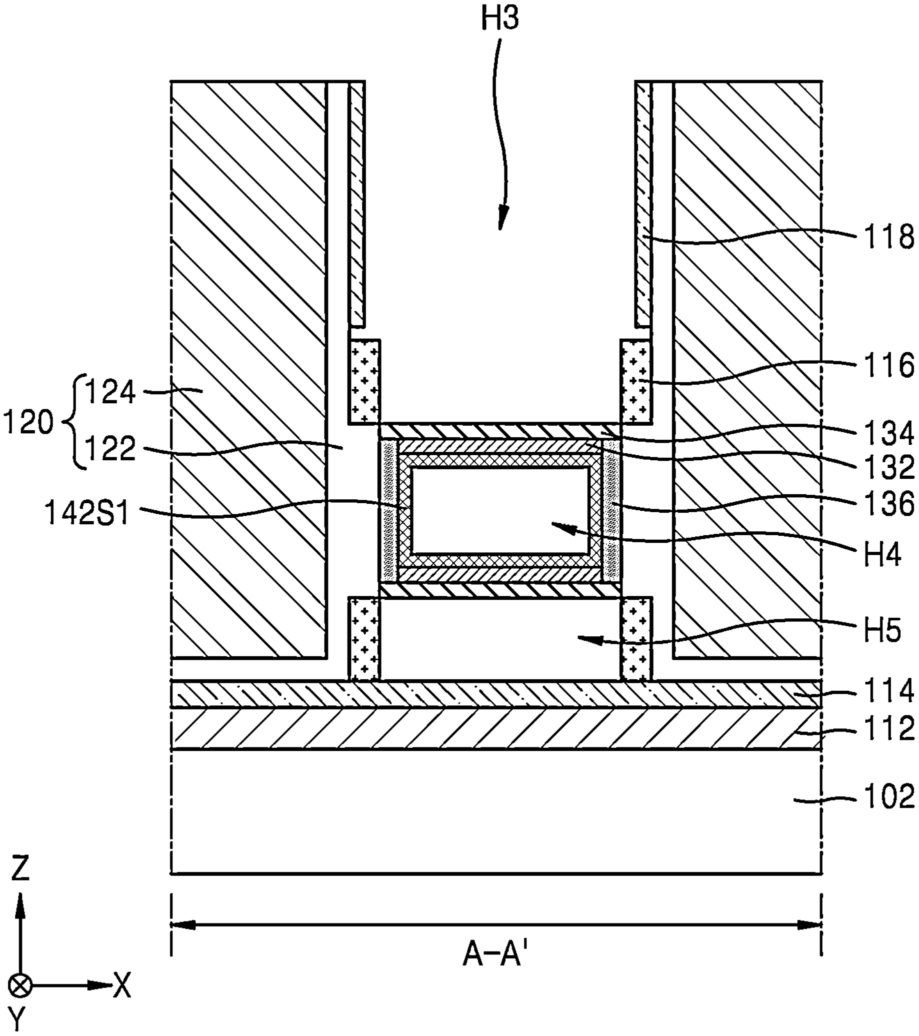
Figure 29B:
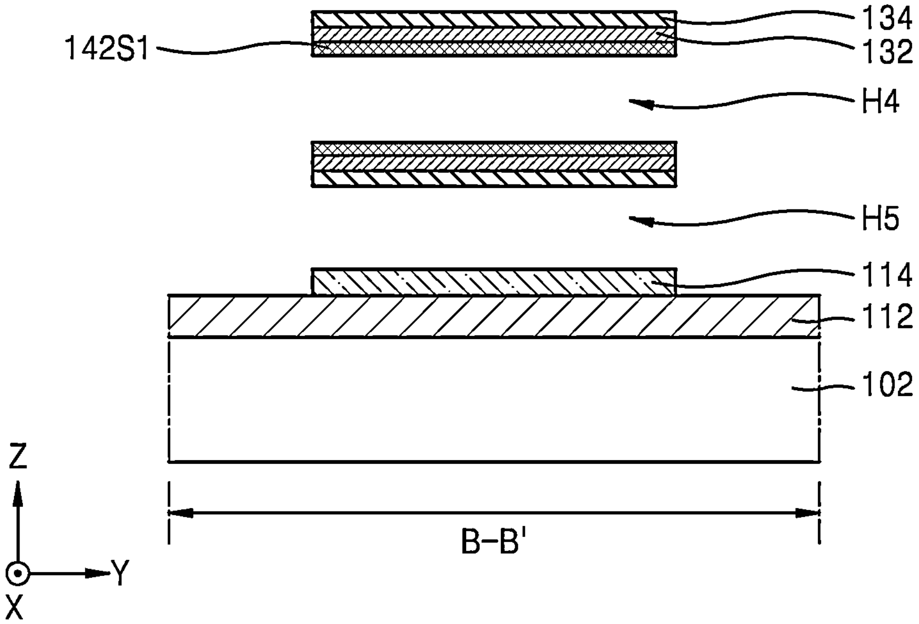

Referring to FIGS. 29A and 29B, in a result of FIGS. 28A and 28B, the first sacrificial layer SL1 (see FIG. 28A) and the third sacrificial layer SL3 may be removed through the third hole H3. The third hole H3 may be expanded by removing the first sacrificial layer SL1 located on a relatively upper side among the first sacrificial layers SL1. In addition, a fourth hole H4 may be formed by removing the third sacrificial layer SL3, and a fifth hole H5 may be formed by removing the first sacrificial layer SL1 located on a relatively lower side among the first sacrificial layers SL1. The third hole H3, the fourth hole H4, and the fifth hole H5 may be communicatively connected to each other.

Figure 30A:
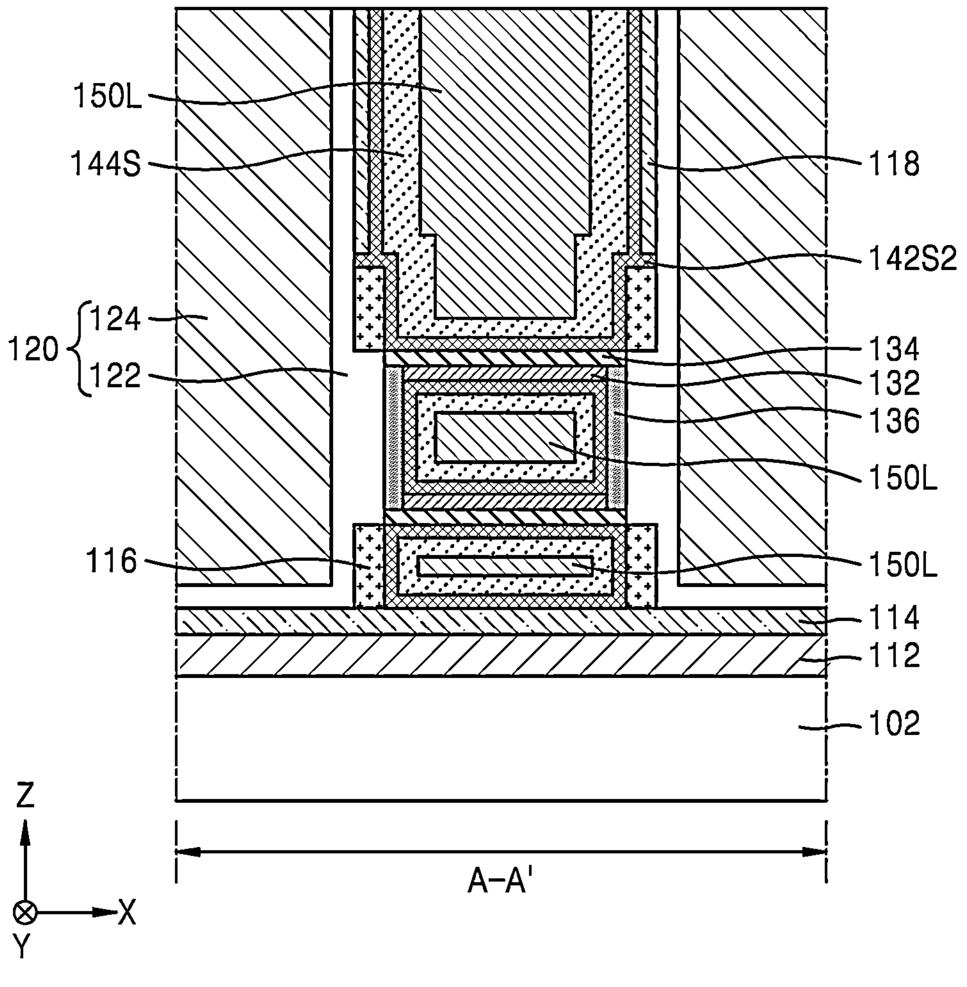
Figure 30B:
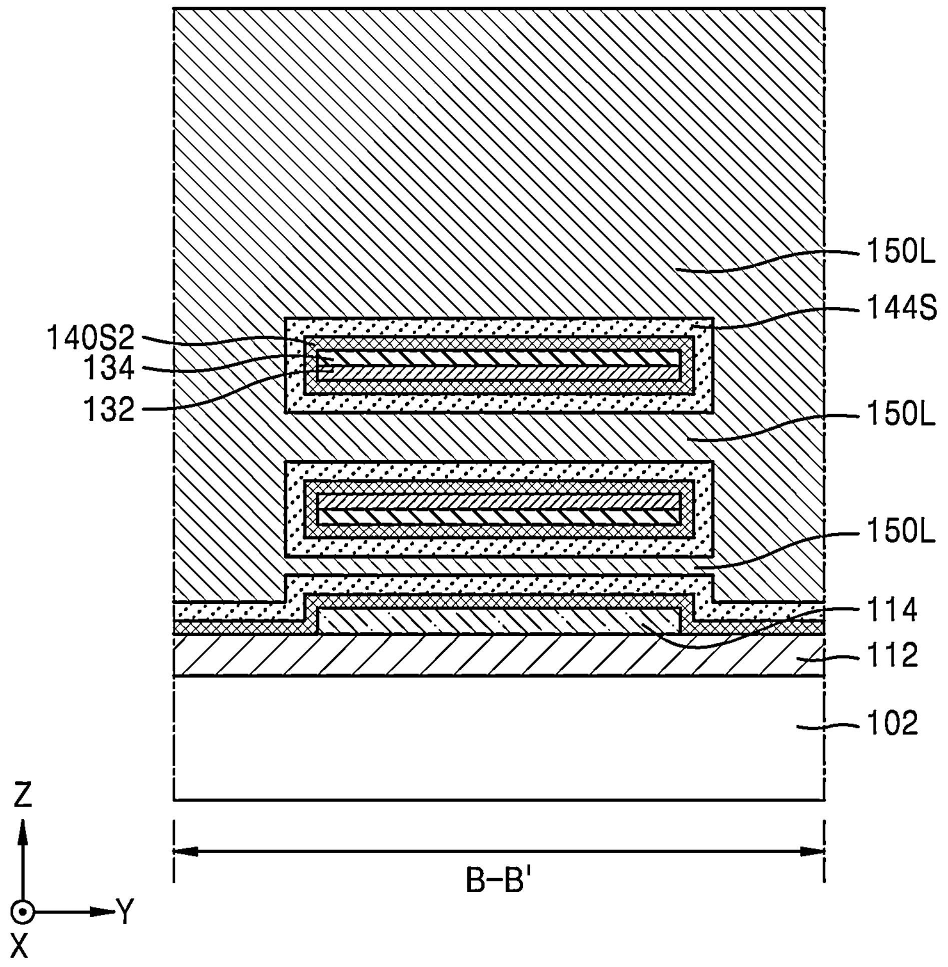

Referring to FIGS. 30A and 30B, in a result of FIGS. 29A and 29B, a dielectric material layer may be formed that covers an exposed surface of each of the etch stop layer 112, the lower insulating layer 114, the seed layer 134, and the horizontal semiconductor layer 132. The dielectric material layer together with the remaining dielectric material layer 142S1 may be defined as a first dielectric material layer 142S2. Next, a second dielectric material layer 144S may be formed that covers a surface of the first dielectric material layer 142S2 may be formed, and a metal material layer 150L filling the third hole H3, the fourth hole H4, and the fifth hole H5.

The first dielectric material layer 142S2 may include substantially the same material as the dielectric material layer 142S1. For example, the dielectric material layer 142S1 and the first dielectric material layer 142S2 may include silicon oxide. The second dielectric material layer 144S may include a metal nitride layer. The metal material layer 150L may include metal, metal carbide, or a combination thereof. The metal material layer 150L may be formed by using an ALD process or a CVD process.

Figure 31A:
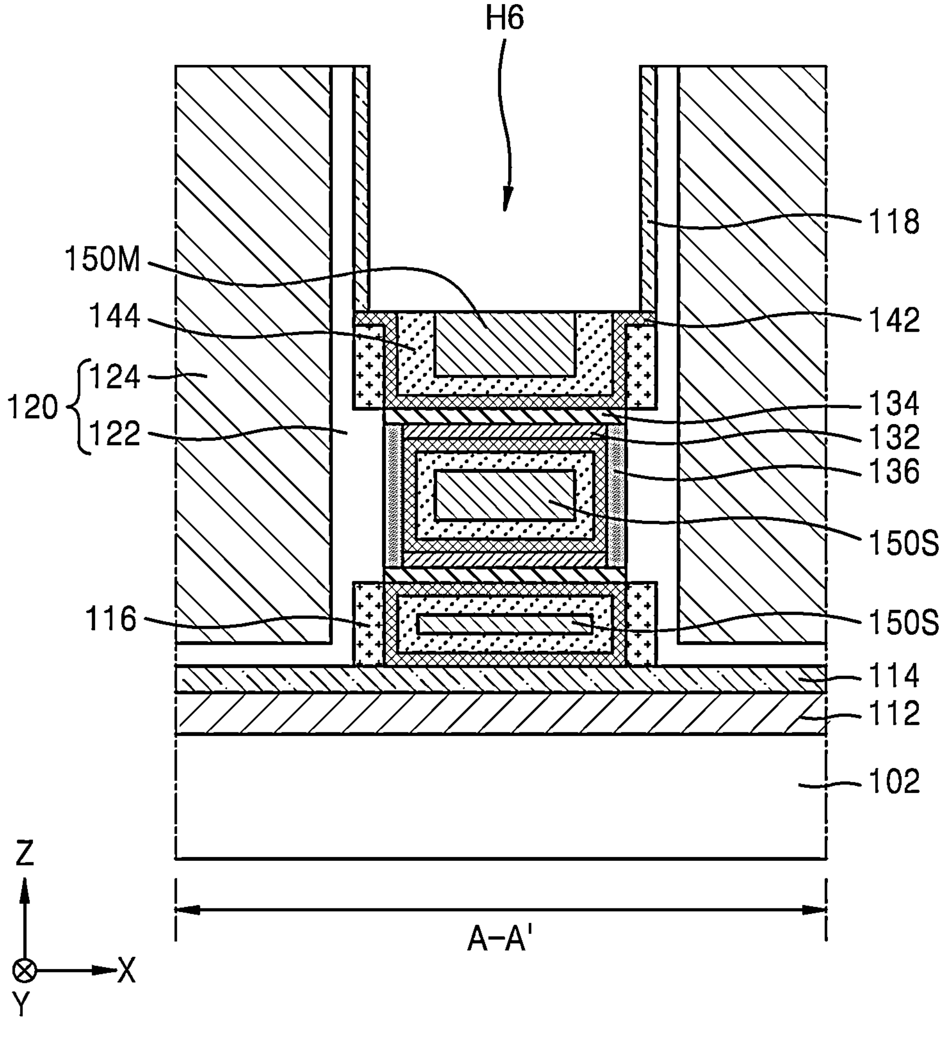
Figure 31B:
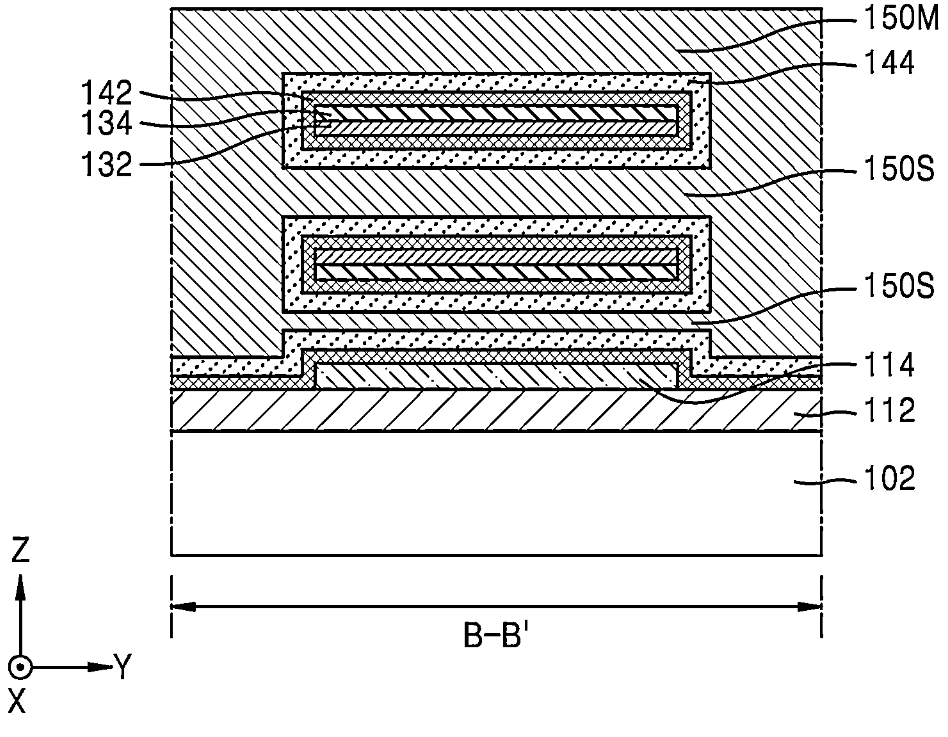

Referring to FIGS. 31A and 31B, in a result of FIGS. 30A and 30B, a part of each of the first dielectric material layer 142S2, the second dielectric material layer 144S, and the metal material layer 150L may be removed. At this time, the remaining first dielectric material layer 142S2, second dielectric material layer 144S, and metal material layer 150L may be respectively defined as the first gate dielectric layer 142, the second gate dielectric layer 144, and the gate line 150.

Next, in a result of FIGS. 31A and 31B, the barrier layer 160 (see FIG. 2) and the upper insulating layer 170 (see FIG. 2) may be formed in an area in which the part of each of the first dielectric material layer 142S2, the second dielectric material layer 144S, and the metal material layer 150L are removed, and thus, the semiconductor device 100 illustrated in FIGS. 1 to 3 may be manufactured.

FIGS. 32 to 37 are cross-sectional views for explaining a method of manufacturing the semiconductor device 200 according to some embodiments. Specifically, FIGS. 32 to 37 are cross-sectional views showing sequentially the semiconductor device 200 taken along the line A-A' in FIG. 1, and FIGS. 32 to 37 are cross-sectional views for explaining subsequent processes after performing processes described with reference to FIGS. 12 through 17.

Figure 32:
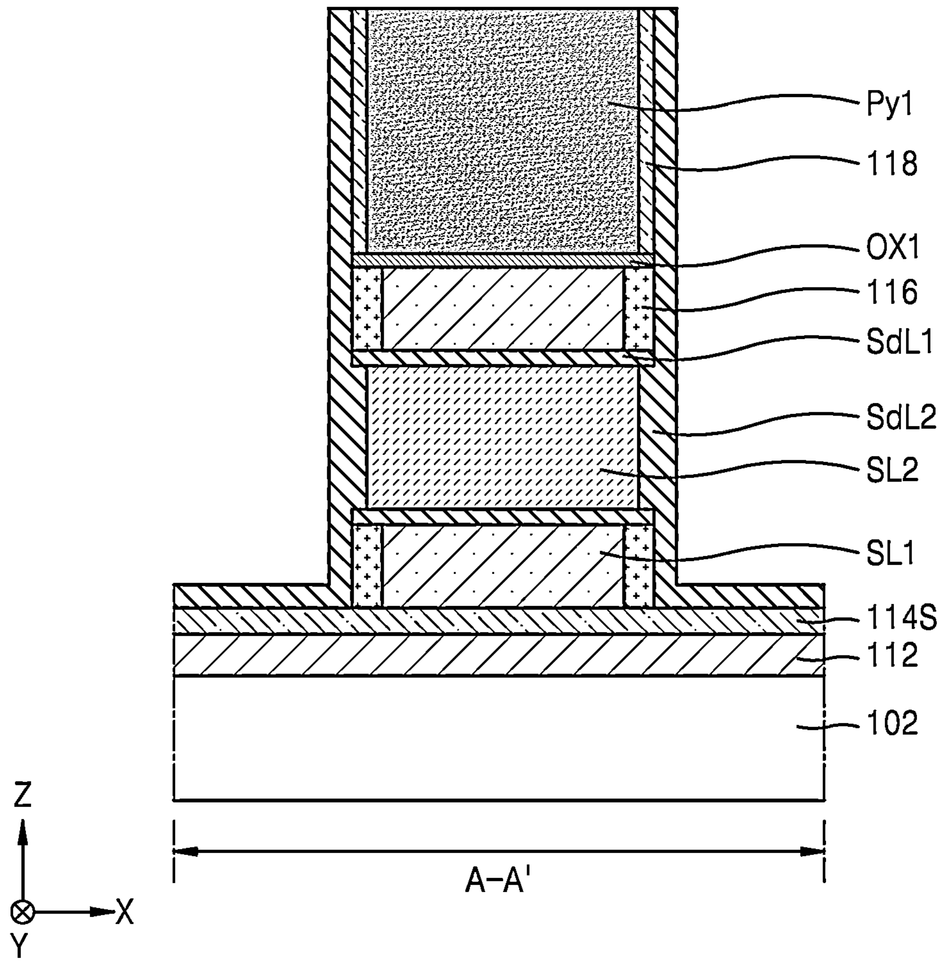
FIGS. 32 to 38 are cross-sectional views for explaining a method of manufacturing a semiconductor device according to some embodiments.

Referring to FIGS. 17 and 32 together, in a result of FIG. 17, the second seed material layer SdL2 may be formed that may be in and may fill the second recess RS2 and may cover a sidewall of the first seed material layer SdL1, a sidewall of the insulating spacer 116, a sidewall of the first oxide layer OX1, a sidewall of the insulating liner 118, and an upper surface of the lower insulating material layer 114S.

Figure 33:
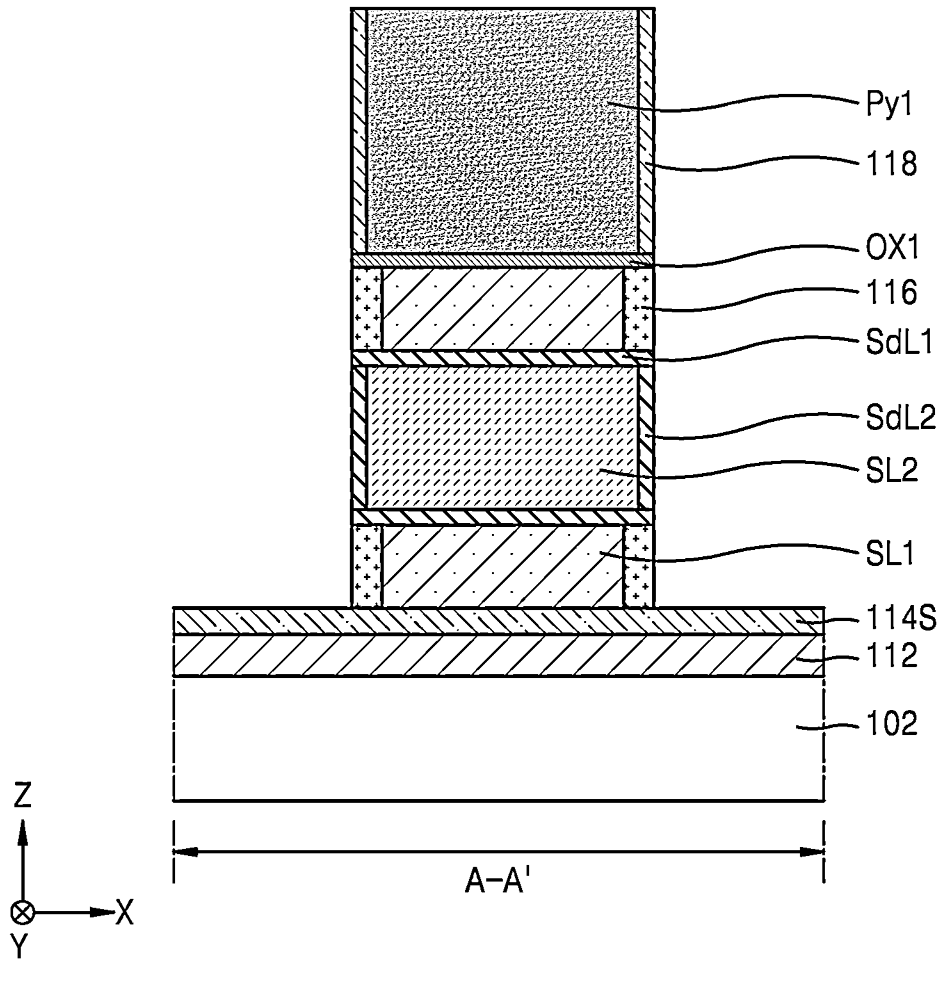

Referring to FIG. 33, in a result of FIG. 32, the remaining part of the second seed material layer SdL2 may be removed so that only a part of the second seed material layer SdL2 remains in the second recess RS2.

Figure 34:
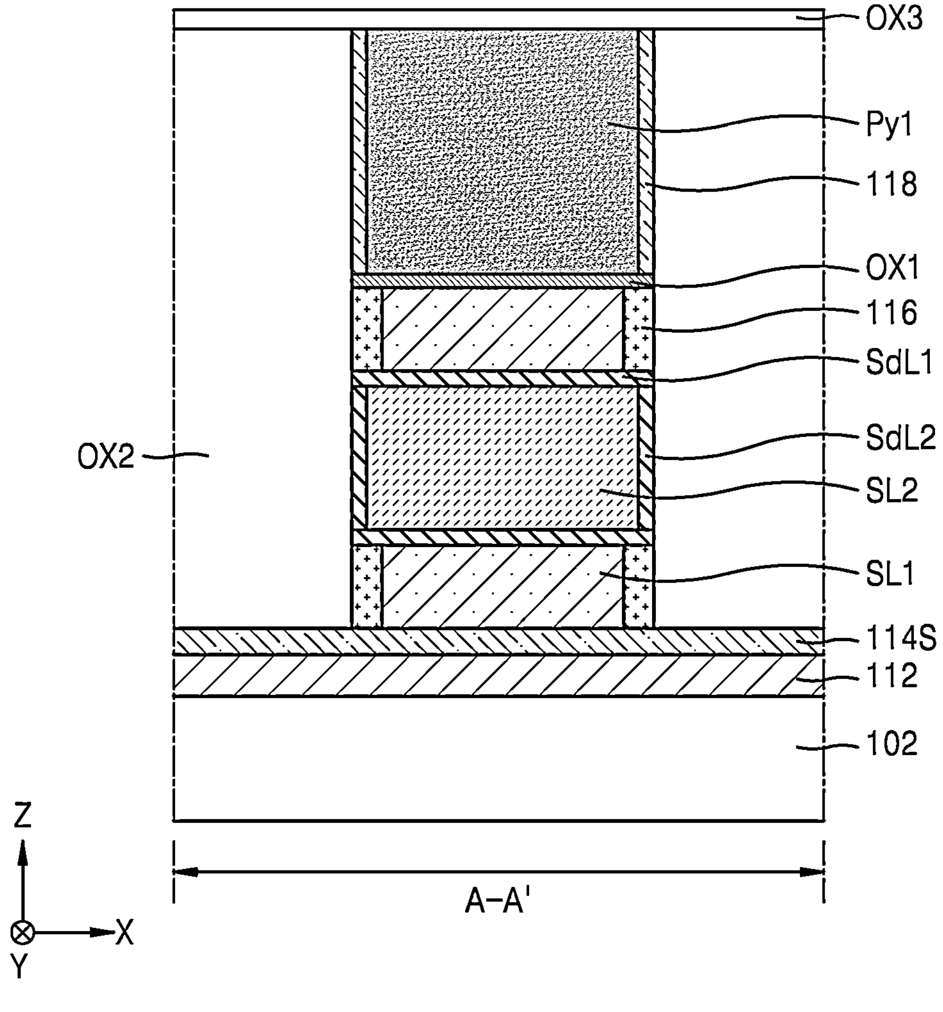

Referring to FIG. 34, in a result of FIG. 33, the second oxide layer OX2 may be formed that may cover an exposed surface of each of the lower insulating material layer 114S, the insulating spacer 116, the first oxide layer OX1, the insulating liner 118, and the second seed material layer SdL2. That is, in contrast to the process described with reference to FIG. 18, in the process described with reference to FIGS. 33 and 34, a part of the second seed material layer SdL2 may be removed first before forming the second oxide layer OX2.

Figure 35:
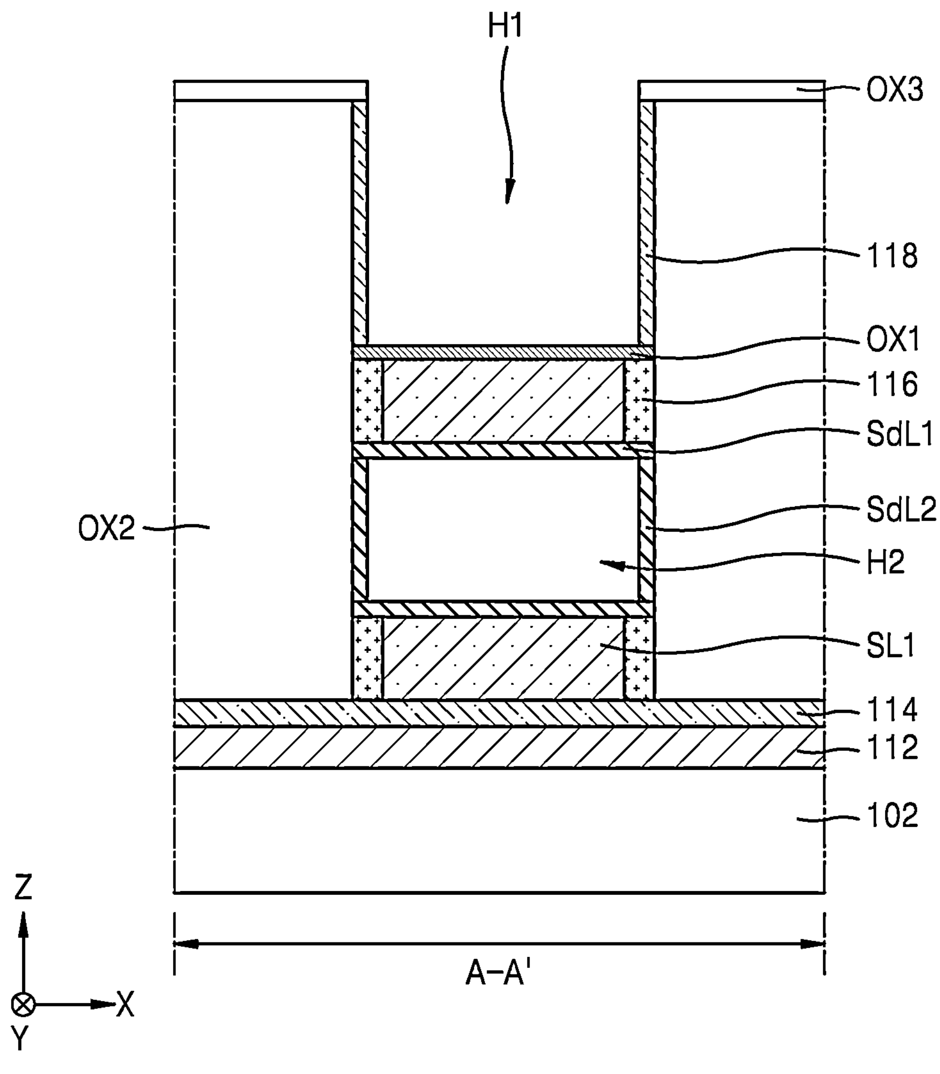

Referring to FIG. 35, in a result of FIG. 34, an upper surface of the dummy gate layer Py1 may be exposed by removing a part of the third oxide layer OX3 that overlaps the dummy gate layer Py1 in the vertical direction (Z direction). Next, the first hole H1 may be formed by removing the exposed dummy gate layer Py1. Next, the second hole H2 may be formed by removing the second sacrificial layer SL2 exposed through the first hole H1. The first hole H1 and the second hole H2 may be communicatively connected to each other.

Figure 36:
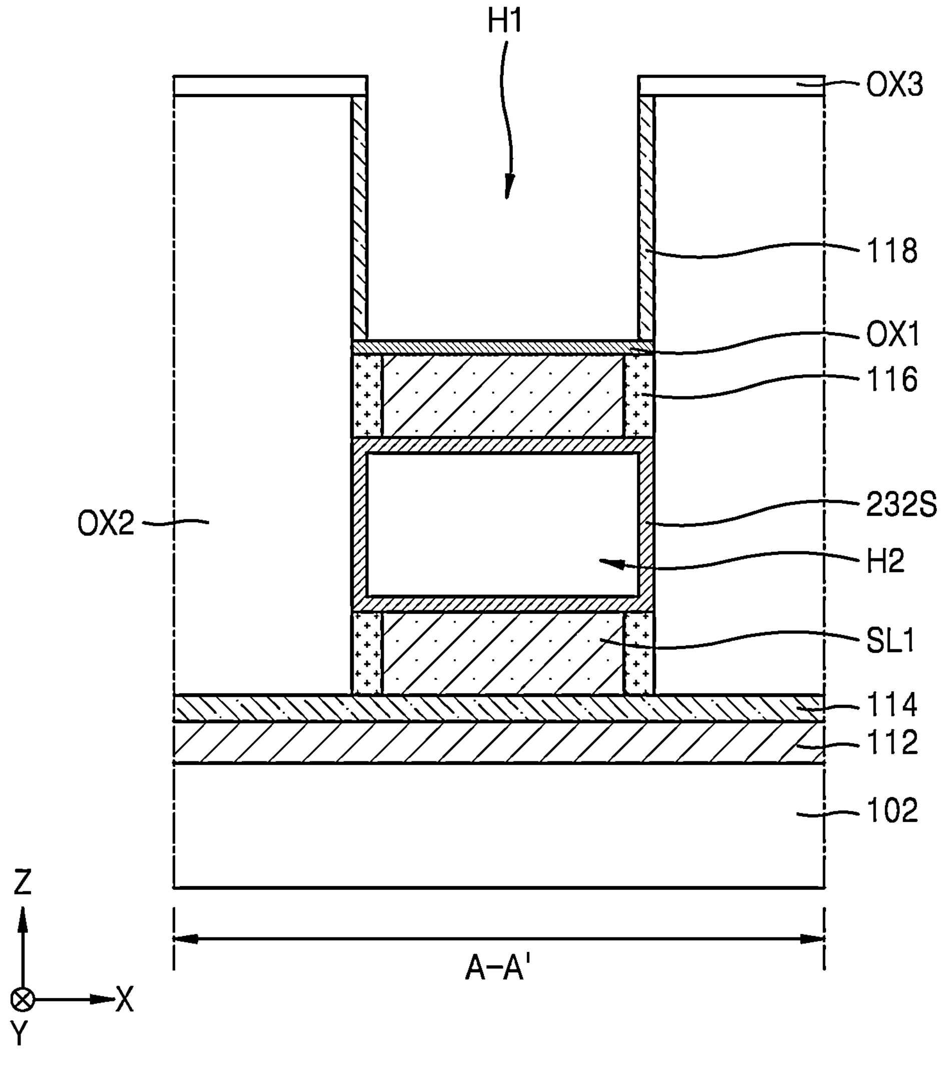

Referring to FIG. 36, in a result of FIG. 35, a semiconductor layer 232S may be formed. The semiconductor layer 232S may be formed through an epitaxial growth process using the seed material layers SdL1 and SdL2 (see FIG. 35). In some embodiments, both the seed material layers SdL1 and SdL2 may be replaced with the semiconductor layer 232S. This may be achieved by using a seed material layer including a material different from or the same as that of the process described with reference to FIGS. 21A and 21B, but varying conditions of a formation process of the semiconductor layer 232S.

Figure 37:
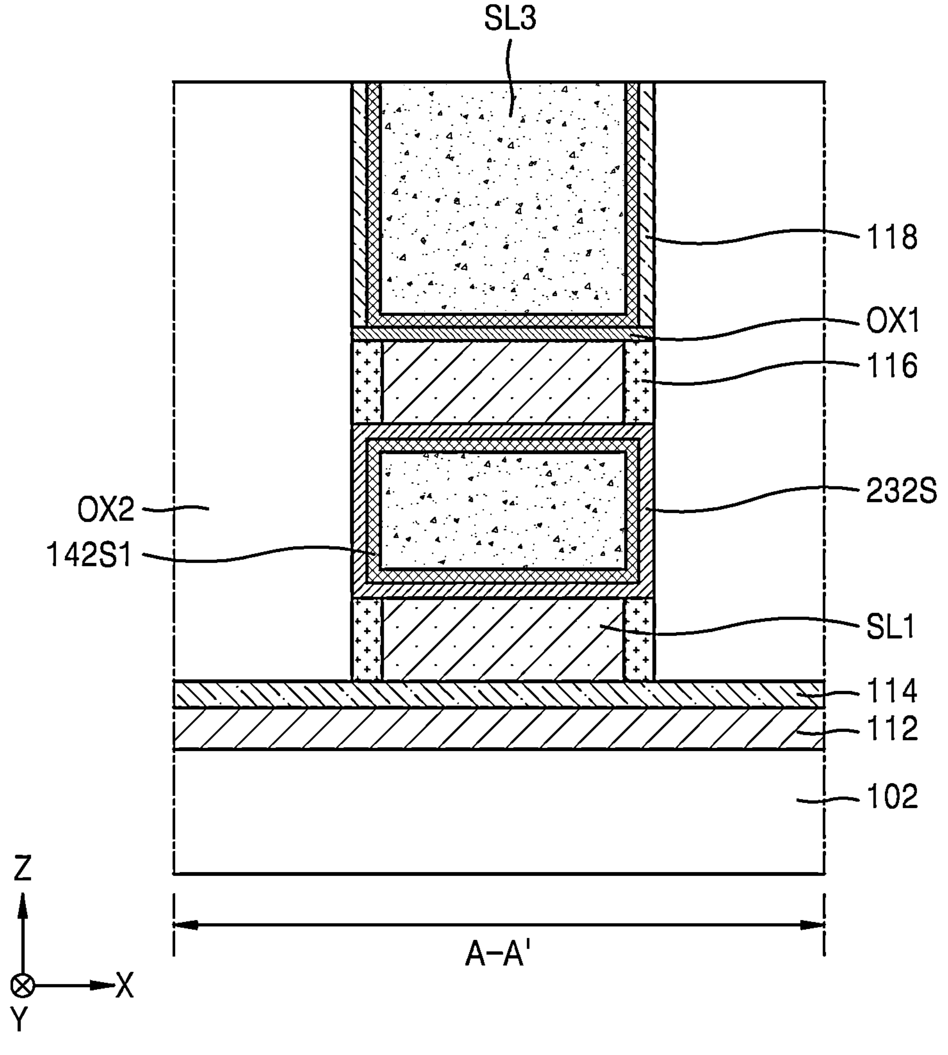

Referring to FIG. 37, in a result of FIG. 36, the dielectric material layer 142S1 may be formed that may cover an exposed surface of each of the first oxide layer OX1, the first sacrificial layer SL1, the semiconductor layer 232S, the lower insulating layer 114, and the etch stop layer 112. Next, the third sacrificial layer SL3 may be formed that may fill the first hole H1 and the second hole H2 and may cover an upper surface of the third oxide layer OX3. Next, a part of the dielectric material layer 142S1, a part of the third oxide layer OX3, and a part of the third sacrificial layer SL3 may be removed.

Figure 38:
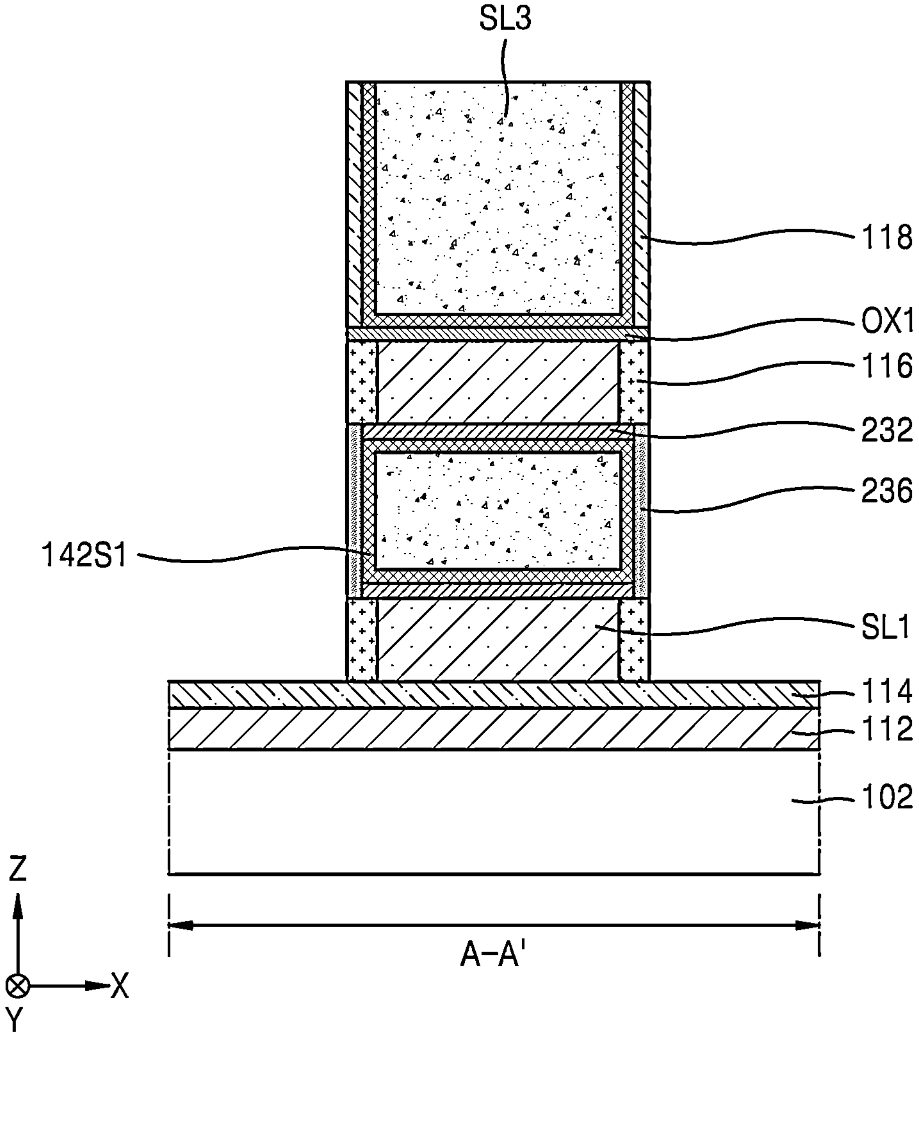

Referring to FIG. 38, the second oxide layer OX2 may be removed from a result of FIG. 37. Next, a part of the semiconductor layer 232S exposed by removing the second oxide layer OX2 may be doped with impurities. As a result, a part of the semiconductor layer 232S that is not doped with the impurity may be defined as the horizontal semiconductor layer 232, and a part of the semiconductor layer 232S that is doped with the impurity may be defined as the vertical semiconductor layer 236.

While the inventive concepts have been particularly shown and described with reference to some examples of embodiments thereof, it will be understood that various changes in form and details may be made therein without departing from the scope of the following claims.

What is claimed is:

1. A semiconductor device comprising:
- a fin-type active region that extends in length in a first horizontal direction on a substrate;
- a horizontal semiconductor layer on the fin-type active region;
- a seed layer on the fin-type active region and in contact with the horizontal semiconductor layer;
- a gate line that surrounds the horizontal semiconductor layer and the seed layer, on the fin-type active region, and that extends in length in a second horizontal direction that intersects the first horizontal direction; and
- a pair of vertical semiconductor layers respectively on first and second sides of the horizontal semiconductor layer in the first horizontal direction, on the fin-type active region, with the horizontal semiconductor layer therebetween,
- wherein an inner wall of each of the first and second vertical semiconductor layers contacts the horizontal semiconductor layer, and upper or lower surfaces of the vertical semiconductor layers contact the seed layer.

2. The semiconductor device of claim 1, wherein a length of the seed layer in the first horizontal direction is greater than a length of the horizontal semiconductor layer in the first horizontal direction.

3. The semiconductor device of claim 1, wherein
- the horizontal semiconductor layer is a first horizontal semiconductor layer, and the semiconductor device further comprises a second horizontal semiconductor layer facing the first horizontal semiconductor layer in a vertical direction, and
- the upper surfaces of vertical semiconductor layers are coplanar with an upper surface of the first horizontal semiconductor layer, and the lower surfaces of the vertical semiconductor layers are coplanar with a lower surface of the second horizontal semiconductor layer.

4. The semiconductor device of claim 1, wherein the horizontal semiconductor layer includes a two-dimensional (2D) semiconductor material, and the 2D semiconductor material includes a transition metal dichalcogenide (TMD).

5. The semiconductor device of claim 4, wherein the seed layer includes an oxide of a transition metal included in the TMD or a catalyst of the oxide of the transition metal.

6. The semiconductor device of claim 4, wherein
- the vertical semiconductor layers include a 2D semiconductor material doped with impurities, and
- the 2D semiconductor material is same as the 2D semiconductor material of the horizontal semiconductor layer.

7. The semiconductor device of claim 1, wherein
- the gate line includes a main gate portion and a sub-gate portion, and the vertical semiconductor layers extend in the first horizontal direction such that an inner wall of an insulating spacer on a sidewall of the main gate portion and an outer wall of one of the vertical semiconductor layers overlap in a vertical direction that intersects the first and second horizontal directions.

8. The semiconductor device of claim 1, wherein
- the gate line includes a main gate portion and a sub-gate portion, and the vertical semiconductor layers extend in the first horizontal direction such that an outer wall of one of the vertical semiconductor layers is positioned between an inner wall of an insulating spacer on a sidewall of the main gate portion and an outer wall of the insulating spacer.

9. The semiconductor device of claim 1, wherein
- the gate line includes a main gate portion and a sub-gate portion, and the vertical semiconductor layers extend in the first horizontal direction such that an outer wall of an insulating spacer on a sidewall of the main gate portion and an outer wall of one of the vertical semiconductor layers overlap in a vertical direction that intersects the first and second horizontal directions.

10. The semiconductor device of claim 1, further comprising: first and second source/drain contacts each contacting an outer wall of a respective one of the vertical semiconductor layers and adjacent to the gate line with the gate line between the first and second source/drain contacts.

11. The semiconductor device of claim 10, wherein each source/drain contact includes a first metal layer contacting the outer wall of the respective vertical semiconductor layer; and a second metal layer covering a surface of the first metal layer.

12. The semiconductor device of claim 11, wherein the first metal layer includes Sb, Bi, In, Se, or a combination of two or more thereof, and the second metal layer includes Au, Ni, Pd, Pt, or a combination of two or more thereof.

13. A semiconductor device comprising:
- a fin-type active region that extends in length in a first horizontal direction on a substrate;
- a pair of horizontal semiconductor layers on the fin-type active region and facing each other in a vertical direction;
- a gate line that surrounds the horizontal semiconductor layers, on the fin-type active region, and that extends in length in a second horizontal direction that intersects the first horizontal direction; and
- a pair of vertical semiconductor layers on first and second sides of the horizontal semiconductor layers in the first horizontal direction, on the fin-type active region, with the horizontal semiconductor layers therebetween, wherein an inner wall of each of the vertical semiconductor layers contacts the horizontal semiconductor layers, upper surfaces of the vertical semiconductor layers are coplanar with an upper surface of a horizontal semiconductor layer located relatively farther from the fin-type active region among the horizontal semiconductor layers, and lower surfaces of the vertical semiconductor layers are coplanar with a lower surface of a horizontal semiconductor layer located relatively closer to the fin-type active region among the horizontal semiconductor layers.

14. The semiconductor device of claim 13, further comprising: a gate dielectric layer between the gate line and the horizontal semiconductor layers, wherein upper and lower surfaces of the vertical semiconductor layers contact the gate dielectric layer.

15. The semiconductor device of claim 13, wherein the gate line includes a main gate portion and a sub-gate portion, and the vertical semiconductor layer extends in the first horizontal direction such that an inner wall of an insulating spacer on a sidewall of the main gate portion and an outer wall of one of the vertical semiconductor layers overlap in the vertical direction.

16. The semiconductor device of claim 13, wherein the gate line includes a main gate portion and a sub-gate portion, and the vertical semiconductor layer extends in the first horizontal direction such that an outer wall of one of the vertical semiconductor layers is positioned between an inner wall of an insulating spacer on a sidewall of the main gate portion and an outer wall of the insulating spacer.

17. The semiconductor device of claim 16, wherein upper and lower surfaces of the one vertical semiconductor layer contact the insulating spacer.

18. The semiconductor device of claim 13, wherein the gate line includes a main gate portion and a sub-gate portion, and the vertical semiconductor layer extends in the first horizontal direction such that an outer wall of an insulating spacer on a sidewall of the main gate portion and an outer wall of one of the vertical semiconductor layers overlap in the vertical direction.

19. The semiconductor device of claim 18, wherein upper and lower surfaces of the one vertical semiconductor layer contact the insulating spacer.

20. A semiconductor device comprising:

a fin-type active region that extends in length in a first horizontal direction on a substrate;

a pair of horizontal semiconductor layers on the fin-type active region and facing each other in a vertical direction;

a pair of seed layers on the fin-type active region and respectively in contact with the pair of horizontal semiconductor layers;

a gate line that surrounds the pair of horizontal semiconductor layers and the pair of seed layers, on the fin-type active region, and that extends in length in a second horizontal direction that intersects the first horizontal direction;

a pair of vertical semiconductor layers respectively on first and second sides of the pair of horizontal semiconductor layers in the first horizontal direction, on the fin-type active region, with the pair of horizontal semiconductor layers therebetween; and a pair of source/drain contacts adjacent to the gate line with the gate line therebetween, wherein inner walls of the pair of vertical semiconductor layers respectively contact the pair of horizontal semiconductor layers, upper and lower surfaces of the pair of vertical semiconductor layers contact the pair of seed layers, an upper surface of each of the pair of vertical semiconductor layers is coplanar with an upper surface of the horizontal semiconductor layer located on a relatively upper side among the pair of horizontal semiconductor layers, and a lower surface of each of the pair of vertical semiconductor layers is coplanar with a lower surface of the horizontal semiconductor layer located on a relatively lower side among the pair of horizontal semiconductor layers.

* * * * *